(12) United States Patent
Yu et al.

(10) Patent No.: US 11,898,254 B2
(45) Date of Patent: *Feb. 13, 2024

(54) PROCESSING METHOD FOR FLUORINATION OF FLUORINATION-TARGET COMPONENT FOR SEMICONDUCTOR FABRICATION EQUIPMENT, WHICH MINIMIZES GENERATION OF CONTAMINANT PARTICLES, AND FLUORINATED COMPONENT OBTAINED THEREBY

(71) Applicant: WONIK QNC Corporation, Gumi-si (KR)

(72) Inventors: Yoonjae Yu, Yongin-si (KR);
Seungyoung Oh, Hwaseong-si (KR);
Eunyoung Choi, Hwaseong-si (KR);
Joohee Jang, Hwaseong-si (KR);
Soyoung Choi, Anseong-si (KR);
Sanghyun Cho, Suwon-si (KR)

(73) Assignee: WONIK QNC Corporation, Gumi-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/965,802

(22) Filed: Oct. 14, 2022

(65) Prior Publication Data
US 2023/0212732 A1 Jul. 6, 2023

(30) Foreign Application Priority Data

Dec. 30, 2021 (KR) .................. 10-2021-0192632

(51) Int. Cl.
*C23C 8/36* (2006.01)
*C23C 8/06* (2006.01)

(52) U.S. Cl.
CPC . *C23C 8/36* (2013.01); *C23C 8/06* (2013.01)

(58) Field of Classification Search
CPC ......... C23C 16/405; C23C 16/56; C23C 8/06; C23C 8/36
See application file for complete search history.

(56) References Cited

U.S. PATENT DOCUMENTS

| 8,206,829 B2 | 6/2012 | Sun et al. | |
| 2016/0273095 A1* | 9/2016 | Lin | H01J 37/32467 |
| 2017/0114440 A1 | 4/2017 | Takai et al. | |
| 2019/0019670 A1 | 1/2019 | Lin et al. | |

(Continued)

OTHER PUBLICATIONS

E Kemnitz et al., "Preparation of Fluorinated-Alumina", Efficient Preparations of Fluorine Compounds Edited by H.W. Roesky, 2013, p. 442.

(Continued)

*Primary Examiner* — Michael P Wieczorek
(74) *Attorney, Agent, or Firm* — YOU & IP, LLC; Wansik You

(57) ABSTRACT

Disclosed are a processing method for fluorination of a fluorination-target component for semiconductor fabrication equipment, which may realize high density and high strength by fluorinating the fluorination-target component using a fluorinating gas excited into plasma, and at the same time, may significantly reduce plasma contaminant particles which are generated during formation of a fluoride coating, and a fluorinated component obtained by the method.

12 Claims, 24 Drawing Sheets

(56) References Cited

U.S. PATENT DOCUMENTS

| | | | |
|---|---|---|---|
| 2020/0283897 A1* | 9/2020 | Deepak | C23C 16/405 |
| 2023/0131168 A1* | 4/2023 | Yu | C23C 8/08 |
| | | | 148/283 |
| 2023/0295798 A1* | 9/2023 | Pape | C23C 16/4404 |
| | | | 427/569 |

OTHER PUBLICATIONS

K Miwa et al, "Fluorination mechanisms of Al2O3 and Y2O3 surfaces irradiated by high-density CF4/O2 and SF6/O2 plasmas", J Vac Sci Technol A 27(4), Jul./Aug. 2009.

T Tsunoura et al., "Fabrication, characterization, and fluorine-plasma exposure behavior of dense yttrium oxyfluoride ceramic", Japanese Journal of Applied Physics 56, 06HC02 (2017).

\* cited by examiner

|  | Initial | New method for fluorination modification of coating | | |
|---|---|---|---|---|
|  | $Y_2O_3$ | 1 time | 5 time | 10 time |
| Component analysis (EDS) | Y : 27at.%<br>O : 58at.%<br>F : 0at.%<br>C : 15at.% | Y : 25at.%<br>O : 54at.%<br>F : 7at.%<br>C : 14at.% | Y : 25at.%<br>O : 50at.%<br>F : 9at.%<br>C : 16at.% | Y : 28at.%<br>O : 48at.%<br>F : 12at.%<br>C : 12at.% |
| Cross-section (FIB) | | | | |
| Y | | | | |
| O | | | | |
| F | | | | |

FIG. 10

Comparative Example

Example-1

Example-2

Example-3

PROCESSING METHOD FOR FLUORINATION OF FLUORINATION-TARGET COMPONENT FOR SEMICONDUCTOR FABRICATION EQUIPMENT, WHICH MINIMIZES GENERATION OF CONTAMINANT PARTICLES, AND FLUORINATED COMPONENT OBTAINED THEREBY

BACKGROUND

Technical Field

The present disclosure relates to a processing method for fluorination of a fluorination-target component for semiconductor fabrication equipment and a fluorinated component obtained thereby, and more particularly, to a processing method for fluorination of a fluorination-target component for semiconductor fabrication equipment, which minimizes the generation of contaminant particles, may realize high density and high strength by fluorinating the fluorination-target component using a fluorinating gas excited into plasma, may significantly reduce plasma contaminant particles by forming a surface layer having a fluorine (F) content within a specific range, may significantly increase productivity by shortening aging time in a backup step, and in particular, may ensure normal etch rate in large-area semiconductor fabrication equipment, and a fluorinated component obtained by the method.

Related Art

Among semiconductor fabrication equipment, semiconductor dry etching equipment needs to be shutdown (down) for equipment inspection or components replacement (maintenance) which is performed on a regular basis, and then should undergo a backup process for normal operation of the semiconductor fabrication equipment before the equipment is restarted.

The backup process in the semiconductor dry etching equipment includes several steps, such as a step of removing water vapor in the equipment (out-gassing step), a step of reducing contaminant particles in the equipment, an aging step for fluorination in the equipment, and a step of verifying the quality of a sample using a mass-produced wafer (In Fab. Data).

Among these steps, the aging step is performed to create a fluoride atmosphere capable of realizing normal etch rate in the semiconductor dry etching equipment. In this aging step, a certain level of corrosive gas is applied to the surface of a plasma-resistant coating ($Al_2O_3$, $Y_2O_3$, YAG, etc.) formed inside the equipment, thereby forming a fluoride layer having a yttrium oxyfluoride (YOF) composition and a thickness of several nm to several hundred nm on the surface.

If the fluoride atmosphere is not sufficiently created inside the semiconductor dry etching equipment, a problem may arise in that the time to repeatedly perform the aging step increases, and thus the operating time of the semiconductor fabrication system is greatly reduced, resulting in a decrease in the productivity of the semiconductor fabrication system and an increase in fabrication cost.

Meanwhile, as an example of a conventional method of forming a fluoride layer, there is known a method in which a component to be fluorinated is placed in a vacuum chamber, and then low-pressure vacuum plasma such as $CF_4$, $SF_6$ or $NF_3$, which is a gas containing fluorine, is generated and the surface of the component is fluorinated by fluorine-containing radicals ("Fabrication, characterization, and fluorine-plasma exposure behavior of dense yttrium oxyfluoride ceramic", T Tsunoura et al, Japanese Journal of Applied Physics 56, 06HC02 (2017), "Fluorination mechanisms of $Al_2O_3$ and $Y_2O_3$ surfaces irradiated by high-density $CF_4/O_2$ and $SF_6/O_2$ plasmas", K Miwa et al, J Vac Sci Technol A 27(4), July/August 2009).

However, this method has disadvantages in that it is required to construct a vacuum chamber and vacuum devices, which is disadvantageous to mass production and economic efficiency, and since a low-pressure plasma process is used, the density of fluorine-containing radicals is low and the fluorination rate is low, thus lowering productivity.

As another example, there is known a method in which a component to be fluorinated is immersed in a solution of HF, $SF_4$, $CHF_3$ or the like, and then the surface of the component is fluorinated by raising the temperature to about 250° C. ("Preparation of Fluorinated-Alumina", E Kemnitz et al, "Efficient Preparations of Fluorine Compounds", Edited by H W Roesky, 2013, 442).

However, this method has disadvantages in terms of process safety because it uses a hazardous solution in handling and treatment processes.

As still another example, U.S. Pat. No. 8,206,829 and/or US Patent Publication No. 2017/0114440 is known. The above patent document discloses a method of coating a surface of a component with a powder material such as $AlF_3$, $YF_3$, AlOF, or YOF by a method such as plasma spraying.

However, this method has disadvantages in that the price of $AlF_3$ or $YF_3$, which is a coating raw material used to form a coating on a ceramic protective layer such as alumina ($Al_2O_3$) or yttria ($Y_2O_3$), is very high, and the raw material suppliers are limited, and thus the supply of the raw material is not smooth, leading to reduced economic efficiency. In addition, there is a problem that generated in a relatively large number of plasma particles are generated during formation of a fluoride coating, thereby reducing the reliability of the fluoride coating.

SUMMARY

Accordingly, the present disclosure has been made in order to solve the above-described problems occurring in the prior art, and an object of the present disclosure is to provide a processing method for fluorination of a fluorination-target component for semiconductor fabrication equipment, which minimizes the generation of contaminant particles, may realize high density and high strength by fluorinating the fluorination-target component using a fluorinating gas excited into plasma, may significantly increase productivity by shortening aging time in a backup step, and in particular, may ensure normal etch rate in large-area semiconductor equipment, and a fluorinated component obtained by the method.

Another object of the present disclosure is to provide a processing method for fluorination of a fluorination-target component for semiconductor fabrication equipment, which minimizes the generation of contaminant particles and may significantly plasma contaminant particles by forming a surface layer containing a fluorine (F) content within a specific range through the adjustment of parameters depending on various process environments or conditions, and a fluorinated component obtained by the method.

Objects to be solved by the present disclosure are not limited to those mentioned above, and other objects not mentioned herein will be clearly understood by those skilled in the art from the following description.

In accordance with one aspect of the present disclosure for achieving the objects and other features of the present disclosure, there is provided a processing method for fluorinating the surface of a fluorination-target component, the method including: a first step of placing the fluorination-target component in a processing chamber having a plasma reaction space; a second step of introducing a mixed gas into the processing chamber, the mixed gas being composed of a discharge gas selected from among He, Ne, Ar, Kr, and Xe, a fluorine-free reactive gas selected from among $O_2$, $N_2$, and air, and a fluorine-containing reactive gas selected from among fluorocarbons, including $CF_4$, $C_2F_6$, and $C_4F_8$, and nitrogen trifluoride ($NF_3$); a third step of supplying the mixed gas, introduced into the processing chamber, into the plasma reaction space; and a fourth step of generating plasma in the plasma reaction space by applying high-frequency power to the processing chamber, and forming a fluoride coating layer by fluorinating the surface of the fluorination-target component by the generated plasma and fluorine-containing radical gas, wherein the content of a fluorine (F) component in yttrium oxyfluoride (YOF) forming a surface layer of the fluoride coating layer is 1 to 10 at. % (atomic percentage).

Preferably, wherein an atmosphere in the processing chamber in the first to fourth steps is an atmospheric-pressure atmosphere or a vacuum atmosphere.

Preferably, wherein the third step of supplying the mixed gas comprises supplying argon (Ar) as the discharge gas, oxygen ($O_2$) as the fluorine-free reactive gas, and carbon tetrafluoride ($CF_4$) as the fluorine-containing reactive gas, and a flow rate ratio of Ar:$O_2$:$CF_4$ is 0.1 to 60:0.1 to 10:0.1 to 10.

Preferably, wherein the high-frequency power in the fourth step is 300 to 400 W at a frequency of 1 to 100 MHz.

Preferably, wherein a temperature inside the processing chamber is room temperature to 400° C.

Preferably, wherein the third step and the fourth step are repeated.

Preferably, wherein a distance between the fluorination-target component and the plasma is 2 mm to 5 mm.

Preferably, wherein the fluoride coating layer on the fluorination-target component is formed to have a thickness of 150 to 200 μm.

The processing method for fluorination of a fluorination-target component according to the present disclosure and a fluorinated component obtained thereby provide the following effects.

First, the present disclosure provides the effect of providing a new-concept component fluorination technology capable of fluoridation processing of a component using specific process factors through high-frequency plasma at room temperature and atmospheric pressure for a plasma-resistant coating which is provided on semiconductor dry etching equipment.

Second, the present disclosure has the effect of significantly reducing plasma contaminant particles.

Third, the present disclosure has the effect of improving productivity by shortening the time of the aging step, which is one of the backup processes being performed in the semiconductor dry etching equipment.

Fourth, the present disclosure has the effects of increasing productivity by increasing the rate of fluorination (process) performed in the aging step, and reducing the cost relatively while applying the present disclosure to a large-area component with high density and high strength.

BRIEF DESCRIPTION OF THE DRAWINGS

FIGS. 2A and 2B show scanning electron microscope images of the surface layer of a fluorination-target component depending on the flow rate of Ar (FIG. 2A), and depicts a graph showing the contents of F and Al depending on the flow rate of Ar (FIG. 2B).

FIGS. 3A and 3B show scanning electron microscope images of the surface layer of a fluorination-target component depending on the flow rate of $O_2$ (FIG. 3A)), and a graph showing the contents of F and Al depending on the flow rate of $O_2$ (FIG. 3B).

FIGS. 4A and 4B show scanning electron microscope images of the surface layer of a fluorination-target component depending on the flow rate of $CF_4$ (FIG. 4A), and a graph showing the contents of F and Al depending on the flow rate of $CF_4$ (FIG. 4B).

FIG. 5A shows scanning electron microscope images of the surface layer of the fluorination-target component depending on plasma power, and FIG. 5B is a graph showing the contents of F and Al depending on plasma power.

FIG. 6A shows scanning electron microscope images of the fluorination-target component depending on the temperature, and FIG. 6B is a graph showing the contents of F and Al depending on the temperature.

FIG. 7A shows scanning electron microscope images of the surface of the fluorination-target component depending on the number of repetitions, and FIG. 7B is a graph showing the contents of F and Al depending on the number of repetitions.

FIG. 8A shows scanning electron microscope images of the surface layer of the fluorination-target component depending on the distance, and FIG. 8B is a graph showing the contents of F and Al depending on the distance.

FIG. 10 is a table showing cross-sectional images and component analysis of a fluorination-target component depending on the number of repetitions in the processing method for fluorination of a fluorination-target component according to the present disclosure.

DETAILED DESCRIPTION

Figure 1:
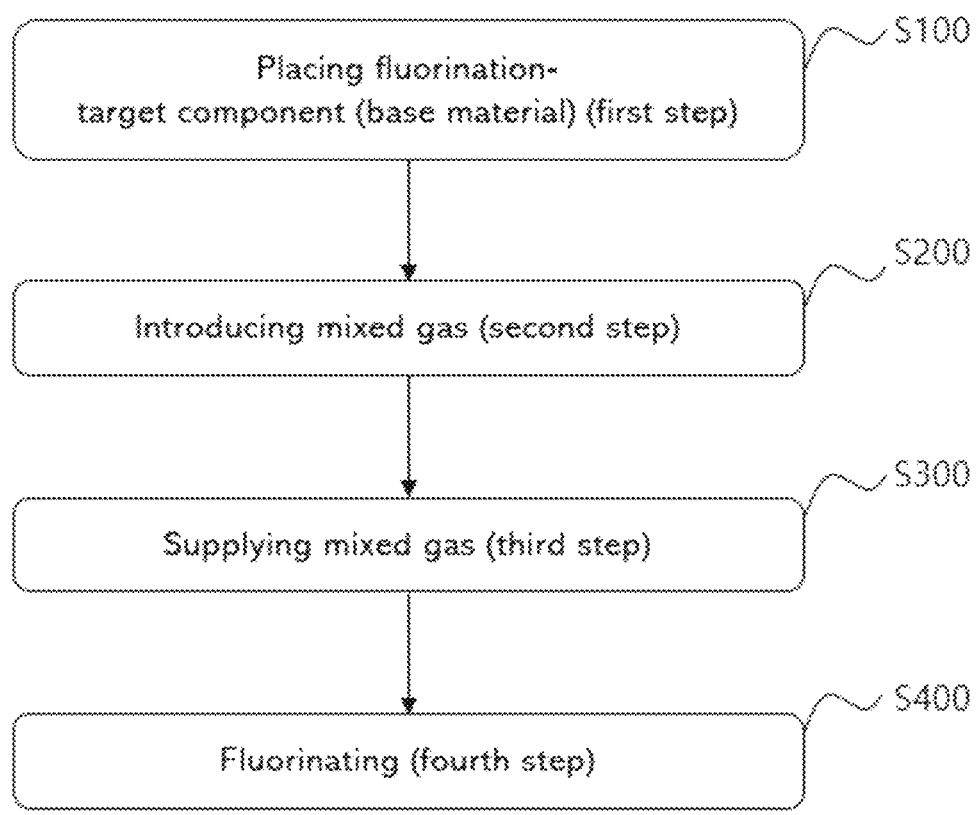
FIG. 1 is a flow chart showing a processing method for fluorination of a fluorination-target component according to the present disclosure.

Additional objects, features and advantages of the present disclosure may be more clearly understood from the following detailed description and the accompanying drawings.

Prior to describing the present disclosure in detail, the present disclosure can make various changes and can have various embodiments, so it should be understood that examples described below and illustrated in the drawings are not intended to limit the present disclosure to specific embodiments, but include all modifications, equivalents, and substitutes included in the spirit and scope of the present disclosure.

In addition, in the description with reference to the accompanying drawings, like components are denoted as like reference numerals, and a redundant description thereof will be omitted. In describing the present disclosure, if it is determined that a detailed description of a related known technology may unnecessarily obscure the gist of the present disclosure, the detailed description will be omitted.

Hereinafter, a processing method for fluorination of a fluorination-target component according to a preferred embodiment of the present disclosure will be described in detail with reference to the accompanying drawings.

FIG. 1 is a flow chart showing a processing method for fluorination of a fluorination-target component according to the present disclosure.

The processing method for fluorination of a fluorination-target component according to the present disclosure is a processing method for fluorinating the surface of a fluorination-target component, which is used in, for example, a semiconductor process. As shown in FIG. 1, the processing method generally includes step (S100) of placing the fluorination-target component; step (S200) of introducing a mixed gas; step (S300) of supplying the mixed gas; and step (S400) of fluorinating the surface of the fluorination-target component.

Specifically, the processing method for fluorination of a fluorination-target component according to the present disclosure is a processing method for fluorinating the surface of a fluorination-target component, which is used in, for example, a semiconductor process, and as shown in FIG. 1, the processing method includes: a first step (S100) of placing the fluorination-target component in a processing chamber of a fluorination processing apparatus, which has a plasma jet outlet and a plasma reaction space, so as to face the plasma jet outlet; a second step (S200) of introducing a mixed gas into the processing chamber, the mixed gas being composed of a discharge gas selected from among He, Ne, Ar, Kr, and Xe, a fluorine-free reactive gas selected from among $O_2$, $N_2$, and air, and a fluorine-containing reactive gas selected from fluorocarbons, including $CF_4$, $C_2F_6$, and $C_4F_8$, and nitrogen trifluoride ($NF_3$); a third step (S300) of supplying the mixed gas, introduced into the processing chamber, into the plasma reaction space; and a fourth step (S400) of generating plasma in the plasma reaction space by applying high-frequency power to a metal electrode rod provided in the processing chamber, and fluorinating the surface of the fluorination-target component by jetting the generated plasma and fluorine-containing radical gas through the plasma jet outlet, thereby forming a fluoride coating layer, wherein the atmosphere in the processing chamber in the first to fourth steps (S100 to S400) is an atmospheric-pressure atmosphere, and the third step (S300) and the fourth step (S400) are performed 1 to 10 times.

In the present disclosure, the content of F in YOF forming the surface layer of the fluoride coating layer is within a specific range. Specifically, the content of F is preferably 1 to 10 at. % (atomic percentage), preferably 2 to 9 at. %, more preferably 3 to 7 at. %. This content of F may significantly reduce the generation of plasma contaminant particles, as confirmed by repeated experiments conducted by the inventors of the present disclosure. This will be described later.

In addition, the content of F may be achieved by adjusting parameters (gas flow rate ratio, plasma intensity (high-frequency power intensity), chamber atmosphere, chamber temperature, etc.) depending on various process environments or conditions in the processing method for fluorination.

The first step (S100) of placing the fluorination-target component is a process of placing the fluorination-target component in a processing chamber of a fluorination processing apparatus, which has a plasma jet outlet and a plasma reaction space, so as to face the plasma jet outlet. In this step, the fluorination-target component is placed on a support (a support provided with a heater) located inside the processing chamber, and the door of the processing chamber is closed to isolate the interior from the outside.

The fluorination processing apparatus having the processing chamber, which is used in the step (S100) of placing the fluorination-target component, may include, for example: a metal electrode rod whose surface is insulated by an insulator; a non-conductive ceramic tube provided coaxially with the metal electrode and extending while being spaced from the metal electrode rod; a grounding tube extending around the outer circumferential surface of the non-conductive ceramic tube and electrically grounded, wherein the entire inner circumferential surface of the grounding tube is in contact with the non-conductive ceramic tube; and a plasma jet outlet head module having a plasma reaction space consisting of an annular space between the outer circumferential surface of the metal electrode rod and the inner circumferential surface of the non-conductive ceramic tube and extending in the lengthwise direction, wherein the open portion at the bottom of the annular space becomes a plasma jet outlet.

In addition, the processing chamber may include: a high-frequency power supply device configured to apply high-frequency power to the metal electrode rod and connected to the metal electrode rod through a high-frequency matching box that performs impedance matching; a gas supply unit configured to supply the mixed gas including the fluorine-containing reactive gas to the plasma reaction space; and a sample support provided at the bottom of the plasma jet outlet and on which the sample is placed.

The top of the plasma jet head module is fixed to the top of the processing chamber, the metal electrode rod is disposed to penetrate the processing chamber and extends vertically downward, the top of the metal electrode rod is connected to the high-frequency matching box, the non-conductive ceramic tube extends downward in the lengthwise direction while the top thereof is located in the gas chamber, and the mixed gas is introduced into the plasma reaction space from the processing chamber.

Next, the second step (S200) of introducing a mixed gas is a process of introducing a mixed gas into the processing chamber, the mixed gas being composed of a discharge gas selected from among He, Ne, Ar, Kr, and Xe, a fluorine-free reactive gas selected from among $O_2$, $N_2$, and air, and a fluorine-containing reactive gas selected from among fluorocarbons, including $CF_4$, $C_2F_6$, and $C_4F_8$, and nitrogen trifluoride ($NF_3$).

In step (S200) of introducing the mixed gas, the discharge gas argon (Ar), the nitrogen-free reactive gas oxygen ($O_2$) and the fluorine-containing reactive gas carbon tetrafluoride ($CF_4$) are introduced into the processing chamber from the respective gas tanks of the gas supply unit.

In this case, the mixed gas is introduced into the processing chamber while the flow rate ratio of the gases is controlled by gas flow rate controllers. In the third step (S300) of supplying the mixed gas, the mixed gas is supplied into the plasma reaction space.

Here, as the discharge gas, insert gas such as He, Ne, Kr or Xe may be used in addition to Ar gas. As the nitrogen-free reactive gas, nitrogen ($N_2$), air or the like may be used in addition to oxygen ($O_2$) gas. As the fluorine-containing gas, a carbon fluoride gas such as $C_2F_6$ or $C_4F_8$, or nitrogen trifluoride ($NF_3$) gas may be used in addition to $CF_4$ gas. However, in the present disclosure, it is preferable to use argon (Ar) gas as the discharge gas, oxygen ($O_2$) as the nitrogen-free reactive gas, and carbon tetrafluoride ($CF_4$) as the fluorine-containing reactive gas.

In addition, the flow rate ratio of Ar:$O_2$:$CF_4$ that are used in step (S200) of introducing the mixed gas is preferably 0.1 to 60:0.1 to 10:0.1 to 10, more preferably 25 to 40:0.1 to 0.4:0.3 to 1.0.

Through experimented on the flow rate ratio of Ar:$O_2$:$CF_4$ used to form a fluoride coating of the present disclosure, the inventors of the present disclosure have found that the above-described flow rate ratio is an optimal ratio and significantly reduces plasma contaminant particles.

Experiments on Flow Rate Ratio

Figure 2A:
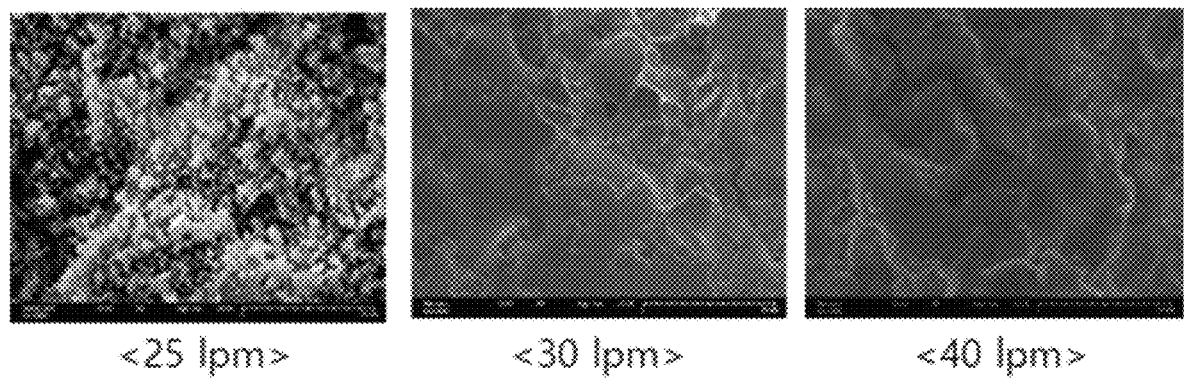
FIGS. 2A and 2B show the results of conducting an experiment on the flow rate ratio of Ar:$O_2$:$CF_4$ gases used in the processing method for fluorination of a fluorination-target component according to the present disclosure. Specifically.
Figure 2B:
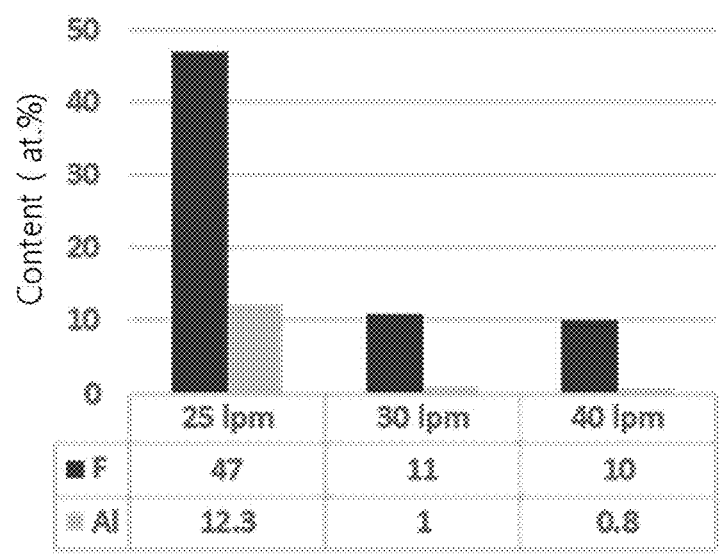
Figure 3A:
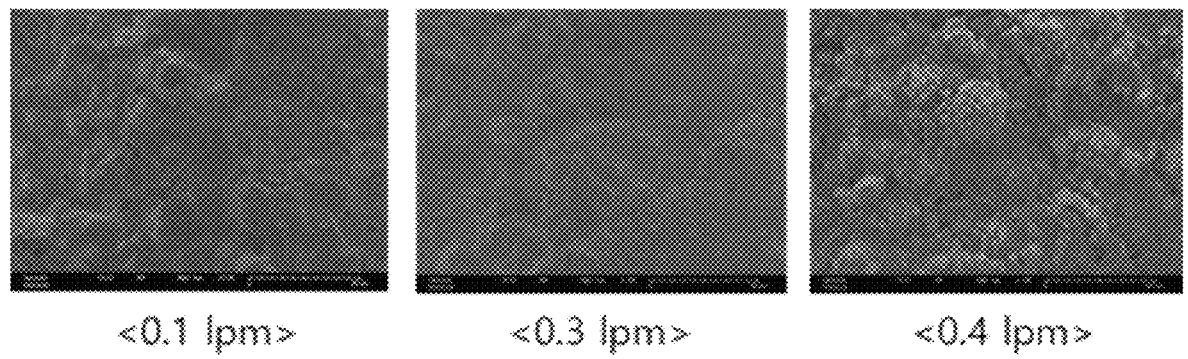
FIGS. 3A and 3B show the results of conducting an experiment on the flow rate ratio of Ar:$O_2$:$CF_4$ gases used in the processing method for fluorination of a fluorination-target component according to the present disclosure. Specifically.
Figure 3B:
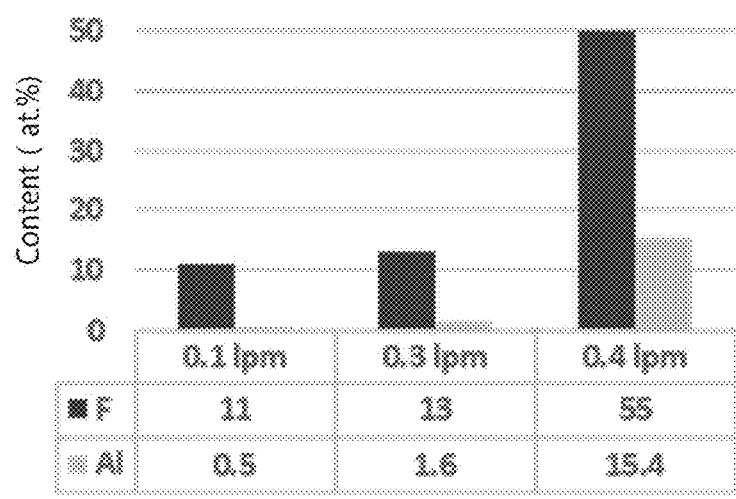
Figure 4A:
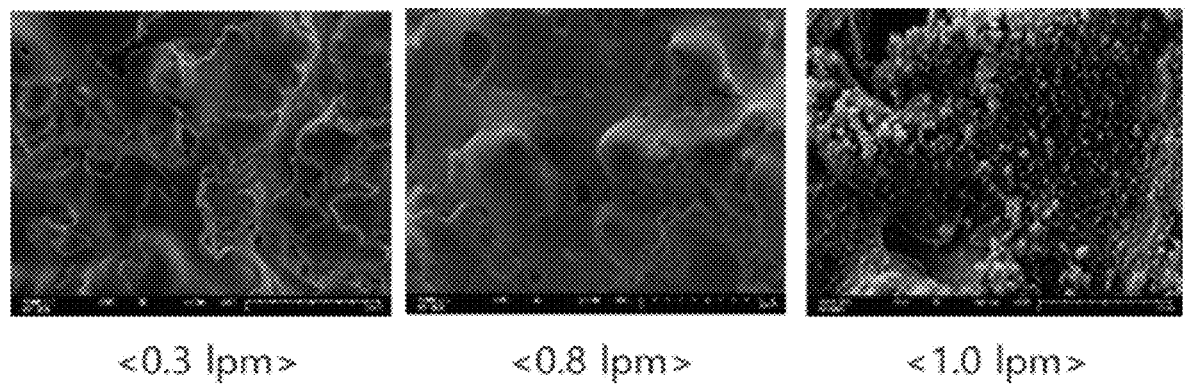
FIGS. 4A and 4B show the results of conducting an experiment on the flow rate ratio of Ar:$O_2$:$CF_4$ gases used in the processing method for fluorination of a fluorination-target component according to the present disclosure. Specifically.
Figure 4B:
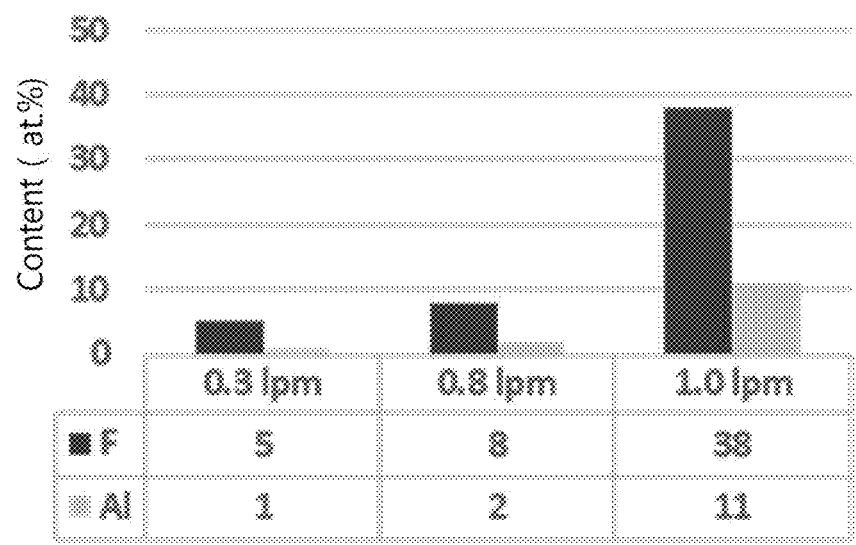

FIGS. 2A to 4B show the results of conducting experiments on the flow rate ratio of Ar:$O_2$:$CF_4$ used in the processing method for fluorination of a fluorination-target component according to the present disclosure. Specifically, FIGS. 2A and 2B show scanning electron microscope images of the surface layer of a fluorination-target component depending on the flow rate of Ar (FIG. 2A), and a graph showing the contents of F and Al depending on the flow rate of Ar (FIG. 2B), FIGS. 3A and 3B show scanning electron microscope images of the surface layer of a fluorination-target component depending on the flow rate of $O_2$ (FIG. 3A), and a graph showing the contents of F and Al depending on the flow rate of $O_2$ (FIG. 3B), and FIGS. 4A and 4B show scanning electron microscope images of the surface layer of a fluorination-target component depending on the flow rate of $CF_4$ (FIG. 4A), and depicts a graph showing the contents of F and Al depending on the flow rate of $CF_4$ (FIG. 4B).

As shown in FIGS. 2A and 2B, the inventors of the present disclosure have found that, if the flow rate of Ar is higher than 40 lpm, some particles occur, and in particular, if the flow rate of Ar is higher than 60 lpm, a problem arises in that a considerable amount of particles occur, and if the flow rate of Ar is lower than 0.1 lpm, a problem arises in that plasma is unstable, and in particular, when the flow rate of Ar is 25 lpm or lower, plasma is stable and thus optimal fluorination processing of the fluorination-target component may be performed.

In addition, as shown in FIGS. 3A and 3B, it has been found that, if the flow rate of $O_2$ is higher than 0.4 lpm, a small amount of particles occur, and in particular, if the flow rate of $O_2$ is higher than 10 lpm, a problem arises in that a considerable amount of particles occur. Furthermore, as shown in FIGS. 4A and 4B, it has been found that, if the flow rate of $CF_4$ is higher than 1.0 lpm, a small amount of particle occur, and in particular, if the flow rate of $CF_4$ is higher than 10 lpm, a problem arises in that a considerable amount of particles occur.

Next, step (S400) of fluorinating the fluorination-target component is a process of generating plasma in the plasma reaction space by applying high-frequency power to a metal electrode rod provided in the processing chamber, and fluorinating the surface of the fluorination-target component by jetting the generated plasma and fluorine-containing radical gas through the plasma jet outlet.

In the fluorinating step (S400) in the present disclosure, the high-frequency power that is applied through the high-frequency power device is preferably 300 to 400 W at a frequency of 1 to 100 MHz.

Figure 5A:
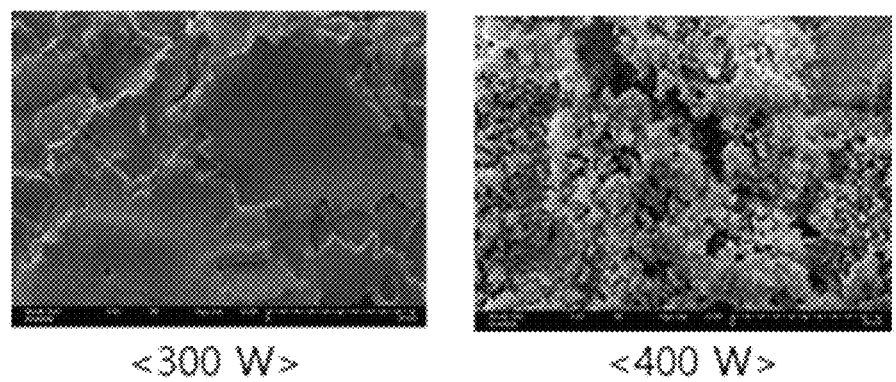
FIGS. 5A and 5B show the results of conducting an experiment on high-frequency power in the processing method for fluorination of a fluorination-target component according to the present disclosure. Specifically.
Figure 5B:
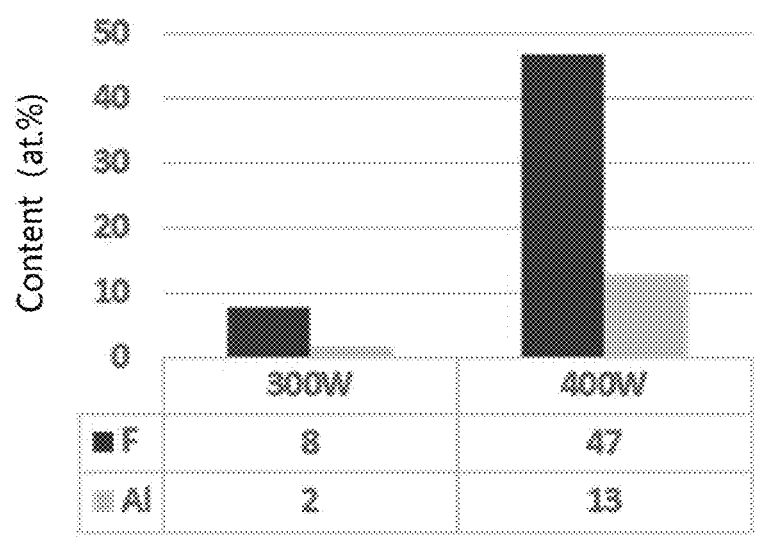

FIGS. 5A and 5B show the results of conducting an experiment on high-frequency power in the processing method for fluorination of a fluorination-target component according to the present disclosure. Specifically, FIG. 5A shows scanning electron microscope images of the surface layer of the fluorination-target component, and FIG. 5B is a graph showing the contents of F and Al.

As shown in FIGS. 5A and 5B, it has been found that, if the high-frequency power that is applied in the fluorinating step (S400) is lower than 100 W and higher than 1,000 W, problems arise in that particles occur and plasma is unstable.

Figure 6A:
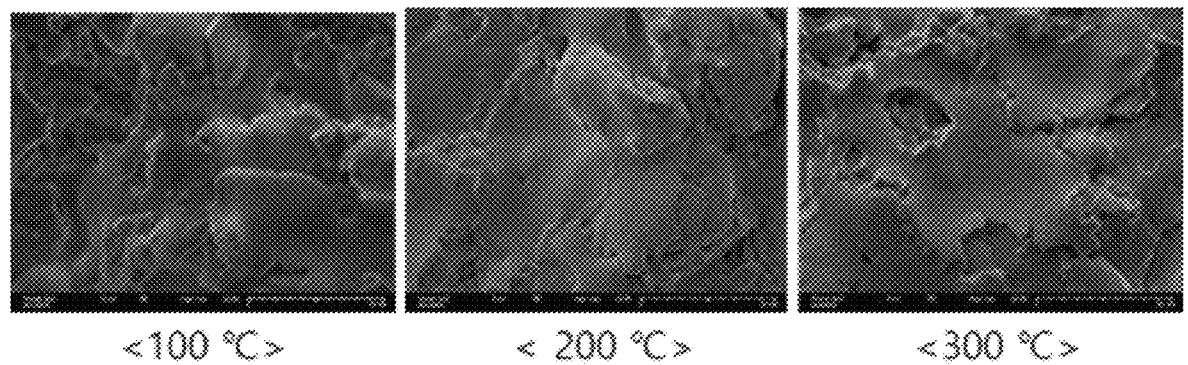
FIGS. 6A and 6B show the results of conducting an experiment on the temperature of the fluorination-target component in the processing method for fluorination of a fluorination-target component according to the present disclosure. Specifically.
Figure 6B:
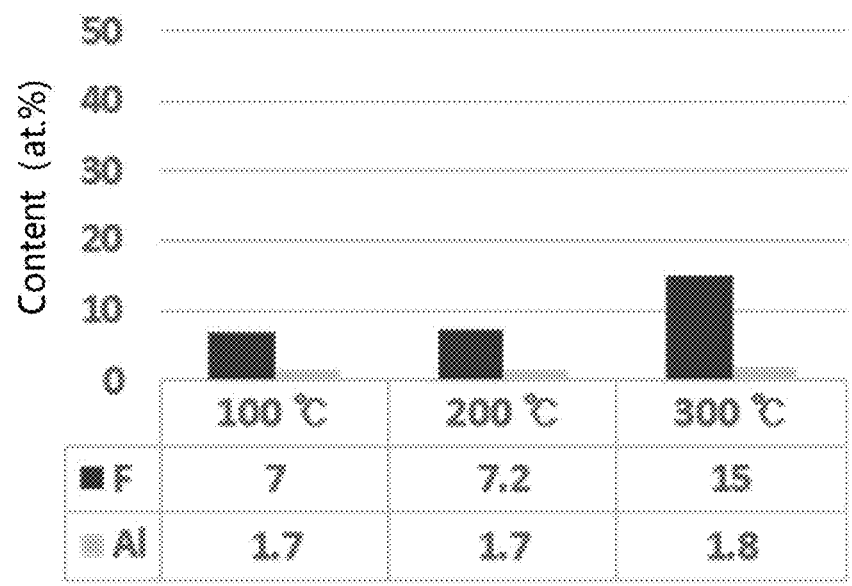

Meanwhile, in the processing method for fluorination of a fluorination-target component according to the present disclosure, the temperature inside the processing chamber, that is, the heating temperature of the fluorination-target component, is preferably room temperature to 400° C. FIGS. 6A and 6B show the results of conducting an experiment on the temperature of the fluorination-target component in the processing method for fluorination of a fluorination-target component according to the present disclosure. Specifically, FIG. 6A shows scanning electron microscope images of the fluorination-target component depending on the temperature, and FIG. 6B is a graph showing the contents of F and Al depending on the temperature.

It has been confirmed that, if the heating temperature of the fluorination-target component in the processing method for fluorination of a fluorination-target component according to the present disclosure is higher than 400° C., a problem arises in that the coating layer on the fluorination-target component is peeled or separated.

In addition, in the processing method for fluorination of a fluorination-target component according to the present disclosure, step (S300) of supplying the mixed gas and step (S400) of fluorinating the fluorination-target component are preferably repeated one or more times.

Figure 7A:
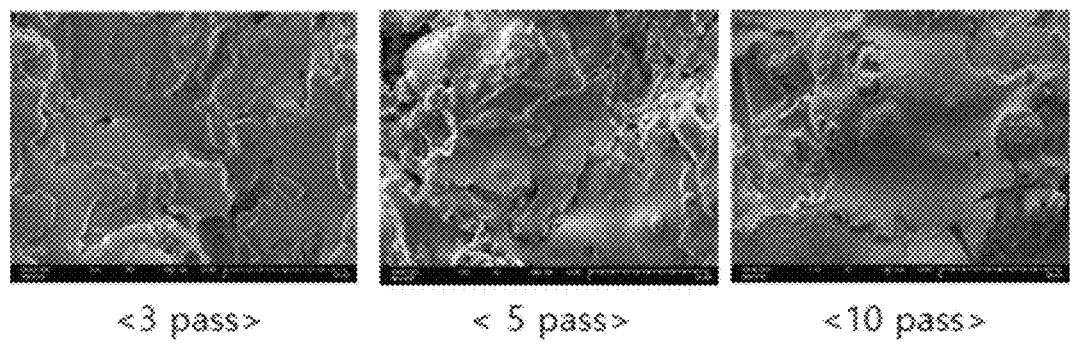
FIGS. 7A and 7B show the results of conducting an experiment on the number of repetitions of the step of supplying the mixed gas and the fluorinating step. Specifically.
Figure 7B:
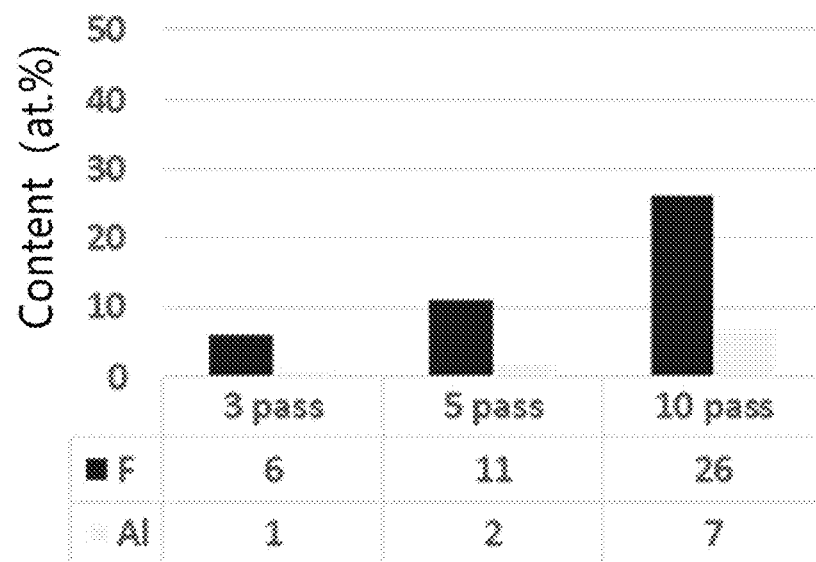

FIGS. 7A and 7B show the results of conducting an experiment on the number of repetitions of the step of supplying the mixed gas and the fluorinating step. Specifically, FIG. 7A shows scanning electron microscope images of the surface of the fluorination-target component depending on the number of repetitions, and FIG. 7B is a graph showing the contents of F and Al depending on the number of repetitions.

Here, when the number of repetitions is one or more and one cycle consists of the step of supplying the mixing gas and the fluorinating step, the pause time between cycles is preferably set to 60 seconds to 10 minutes.

Meanwhile, the inventors of the present disclosure have found that the distance between the fluorination-target component and the plasma is an important process factor in the processing method for fluorination of a fluorination-target component according to the present disclosure. The distance between the fluorination-target component to be fluorinated and the plasma is the distance from the surface of the fluorination-target component to the entrance of the plasma jet outlet.

Figure 8A:
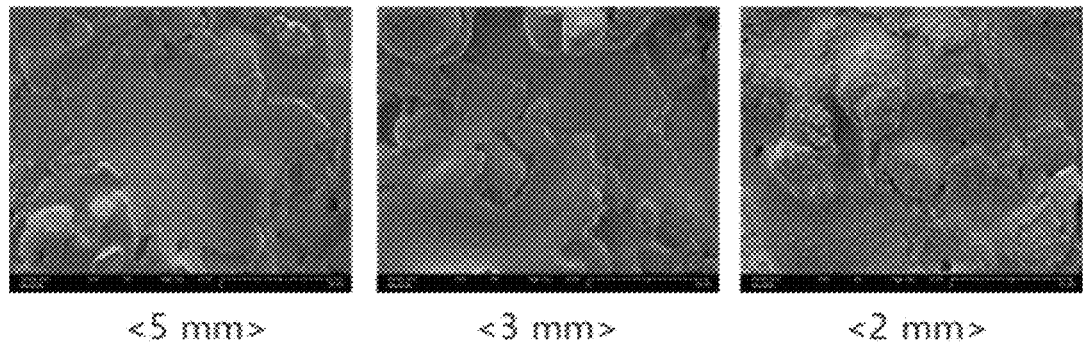
FIGS. 8A and 8B show the results of conducting an experiment on the distance between the fluorination-target component (base material) and the plasma in the processing method for fluorination of a fluorination-target component according to the present disclosure. Specifically.
Figure 8B:
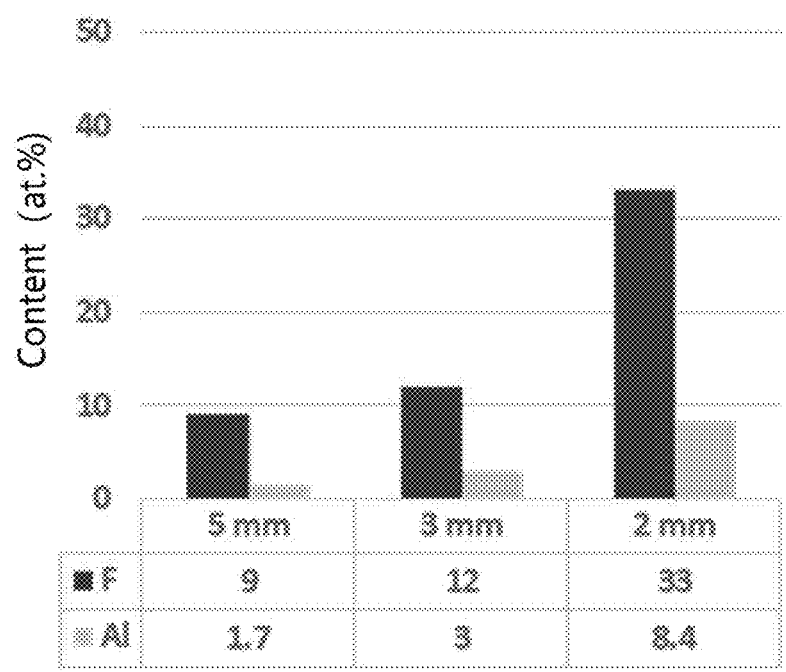

FIGS. 8A and 8B show the results of conducting an experiment on the distance between the fluorination-target component (base material) and the plasma in the processing method for fluorination of a fluorination-target component according to the present disclosure. Specifically, FIG. 8A shows scanning electron microscope images of the surface layer of the fluorination-target component depending on the distance, and FIG. 8B is a graph showing the contents of F and Al depending on the distance.

The distance between the fluorination-target component and the plasma in the processing method for fluorination of a fluorination-target component according to the present disclosure is preferably 1 mm to 50 mm.

The inventors of the present disclosure have found that, if the distance between the fluorination-target component and the plasma is less than 1 mm, problems arises in that particles occur and discharge is difficult, and if the distance between the fluorination-target component and the plasma is more than 50 mm, a problem arises in that discharging voltage needs to be increased, so a large-capacity high-frequency power supply device is required, causing increased costs.

In the processing method for fluorination of a fluorination-target component according to the present disclosure, the fluoride coating layer of the fluorination-target component is preferably formed to have a thickness of 0.001 to 10 μm.

Meanwhile, the inventors of the present disclosure evaluated process factors (power, temperature, and the number of repetitions) capable of forming a fluoride layer by allowing an $Y_2O_3$ coating, produced by atmospheric plasma spraying, to react with fluorine (F)-based corrosive gas.

The $Y_2O_3$ coating produced by atmospheric plasma spraying has a surface roughness of several μm due to the use of granular powder of several tens of μm as a raw fluorination-target component. In order to accurately examine the changes in surface microstructures and elements due to the fluoride coating layer after fluorination modification, the surface was mirror-polished to 0.1 μm, and then the processing method for fluorination (a new method for fluorination modification of coating) according to the present disclosure was applied to the surface.

In order to examine changes in cross-sectional microstructures in a $Y_2O_3$ coating produced by atmospheric plasma spraying, as well as the depth and distribution of the fluoride layer formed using the processing method for fluorination according to the present disclosure, the coating was processed by a focused ion beam and observed under a scanning electron microscope and the content of F component was analyzed using energy dispersive spectroscopy.

In addition, in order to examine the crystal phase change caused by the reaction of the $Y_2O_3$ coating, produced by atmospheric plasma spraying, with F-based corrosive gas, high-resolution X-ray diffraction analysis was performed.

Figure 9:
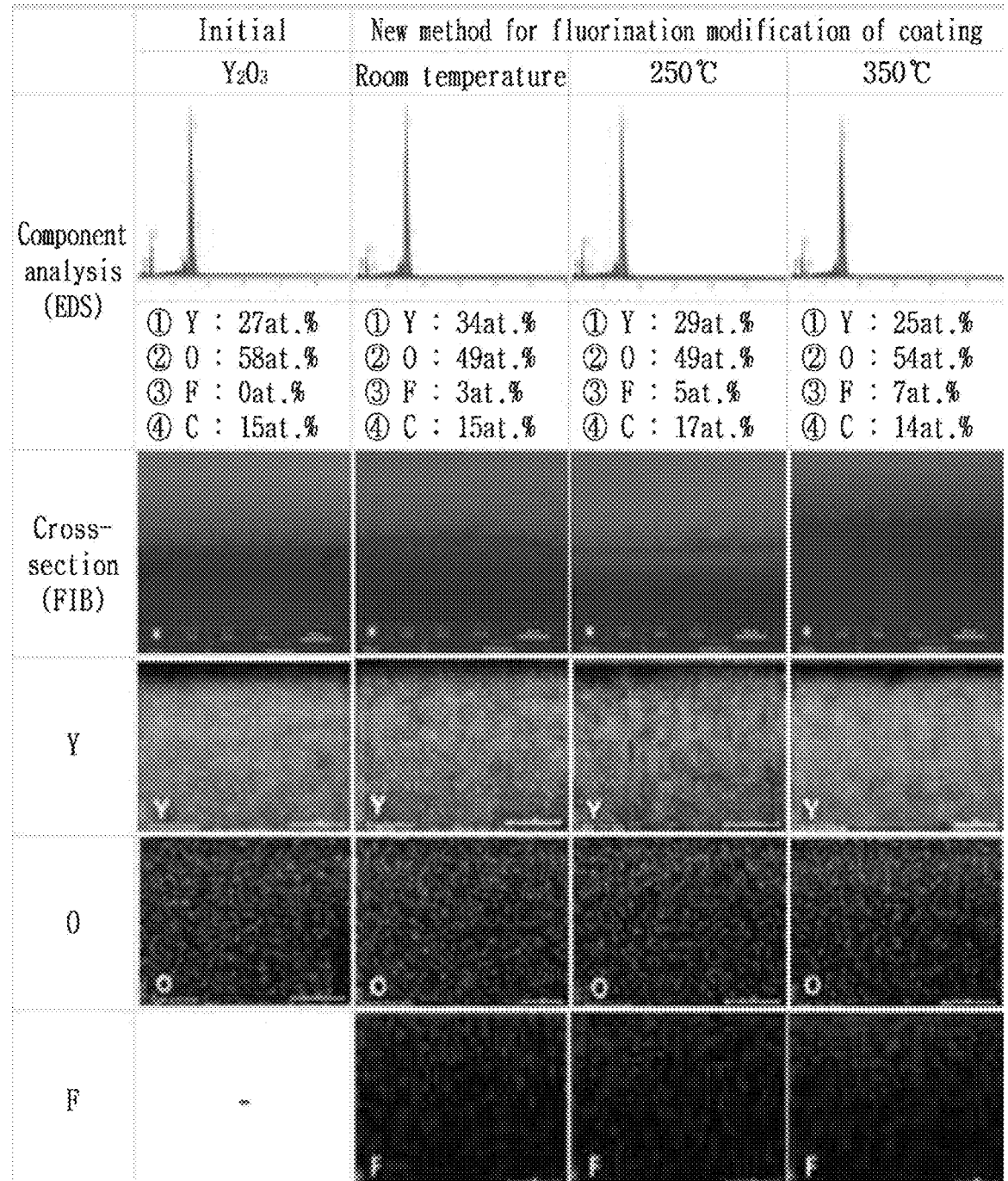
FIG. 9 is a table showing cross-sectional images and component analysis of a fluorination-target component depending on temperature in the processing method for fluorination of a fluorination-target component according to the present disclosure.

FIG. 9 is a table showing cross-sectional images and component analysis of a fluorination-target component depending on temperature in the processing method for fluorination of a fluorination-target component according to the present disclosure.

First, as a result of analyzing the cross-sectional microstructures of the $Y_2O_3$ coating produced by atmospheric plasma spraying method and subjected to mirror polishing, it was confirmed that micropores were hardly observed on the surface, but there were some scratches caused by the mirror polishing, and Y, O and C components were detected in amounts of 27 at. %, 58 at. % and 15 at. %, respectively.

In addition, as a result of observing microstructures in the coating processed by the focused ion beam, it could be confirmed that there were some vertical cracks due to typical volume contraction occurring in the coating formed by atmospheric plasma spraying. As a result of analyzing the component distribution inside the coating using mapping by energy dispersive spectroscopy, it could be confirmed that Y and O components were uniformly distributed throughout the coating.

Meanwhile, in order to examine the tendency of production of a fluoride layer depending on temperature in the processing method for fluorination of a fluorination-target component according to the present disclosure, a fluoride layer was formed by performing the processing method for fluorination according to the present disclosure on the $Y_2O_3$ coating (produced by atmospheric plasma spraying) while changing the temperature to 100, 250 and 350° C.

As a result of observing the surface microstructures in the coating after applying the processing method for fluorination according to the present disclosure, it was confirmed that the coating showed the same microstructures as the $Y_2O_3$ coating (produced by atmospheric plasma spraying) before applying the processing method for fluorination, indicating that the microstructures were not changed by fluorination modification, whereas F was additionally detected in addition to Y, O and C components in the coating, and the detected F increased proportionally as the temperature increased and was present in an amount of 3 to 7 at. %, suggesting that the YOF fluoride layer was effectively formed on the coating surface.

In addition, as a result of observing the microstructures in the coating processed by the focused ion beam, the YOF fluoride layer was not clearly identified near the surface of the coating. However, as a result of performing mapping by energy dispersive spectroscopy, it was confirmed that the color corresponding to the F component existed inside the coating. Furthermore, as the temperature increased, the color contrast near the surface became higher than that inside the coating. This was consistent with the fact that, as the temperature increased, the content of the F component on the coating surface increased to 3, 5 and 7 at. % as mentioned above.

FIG. 10 is a table showing cross-sectional images and component analysis of a fluorination-target component depending on the number of repetitions in the processing method for fluorination of a fluorination-target component according to the present disclosure.

Next, in order to examine the tendency of formation of the fluoride layer depending on the number of repetitions, a fluoride layer was formed by performing the processing method for fluorination (a new method for fluorination modification of a coating) according to the present disclosure on a $Y_2O_3$ coating (produced by atmospheric plasma spraying) while setting the temperature to 350° C. and changing the number of repetitions to 1, 5 and 10.

In addition, as a result of observing the microstructures in the coating processed by the focused ion beam, it was confirmed that the YOF fluoride layer of the fluorination-target target was not clearly identified, like the results of conducting the experiment on the temperature. However, as a result of mapping by energy dispersive spectroscopy, it was confirmed that the color corresponding to the F component existed inside the coating, and as the number of repetitions increased, the contrast of the color on the surface was more clearly distinguished, indicating that the reaction of the F component occurred actively, and the content of F increased up to 12 at. %.

This is because as the number of repetitions increased, the time during which the coating surface was exposed to dissociated F ions increased, and thus the amount of F diffused to the coating surface increased, thus increasing the content of F.

Figure 11:
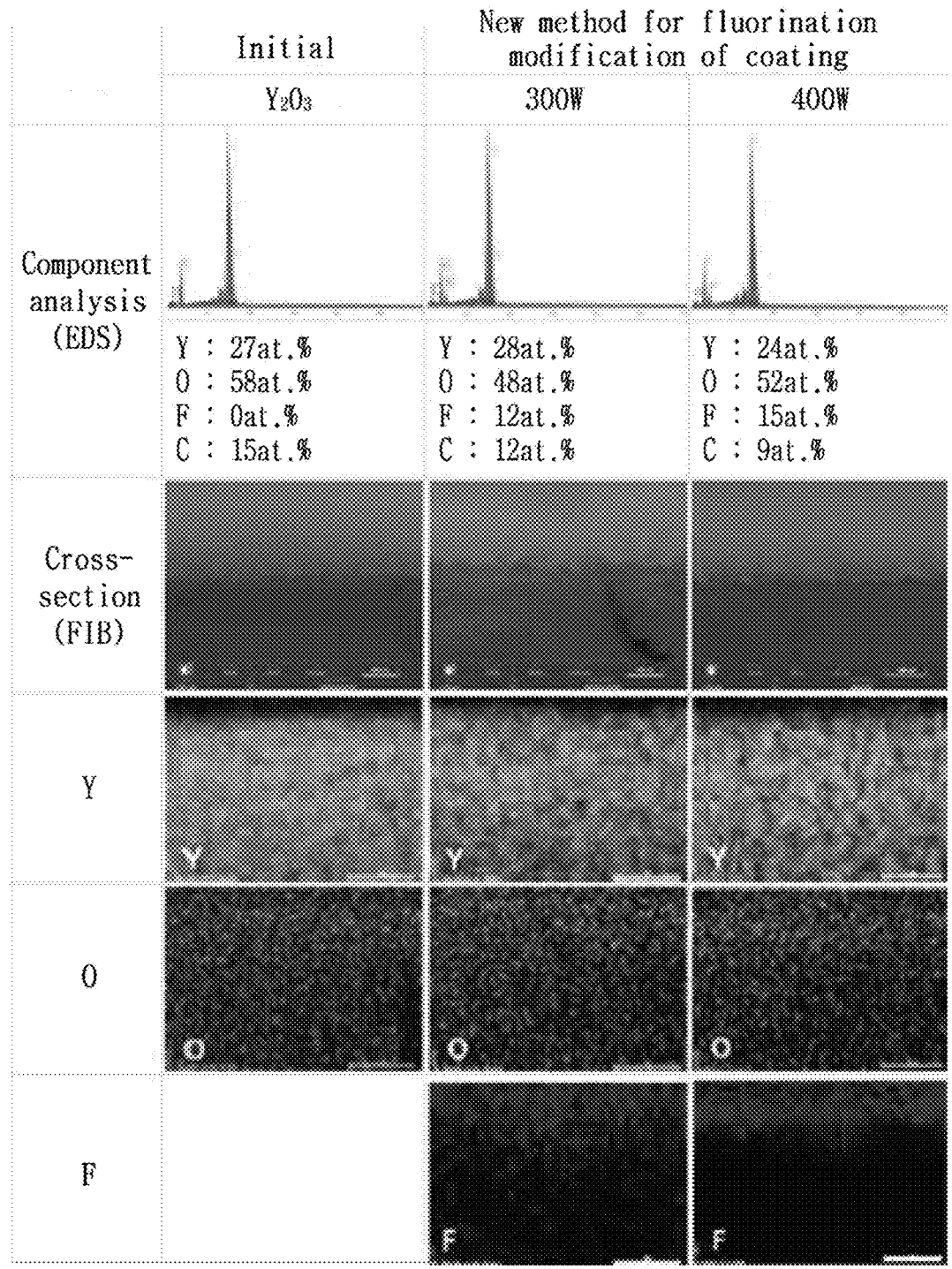
FIG. 11 is a table showing cross-sectional images and component analysis of a fluorination-target component depending on power in the processing method for fluorination of a fluorination-target component according to the present disclosure.

FIG. 11 is a table showing cross-sectional images and component analysis of a fluorination-target component depending on power in the processing method for fluorination of a fluorination-target component according to the present disclosure.

A fluoride layer was formed by performing the processing method for fluorination (a new method for fluorination modification of a coating) according to the present disclosure on a $Y_2O_3$ coating (produced by atmospheric plasma spraying) while setting the temperature to 350° C. and the number of repetitions to 10 and increasing the power from 300 W to 400 W.

It was confirmed that, as the power increased, the content of the F component increased up to 15 at. %, but the YOF fluoride layer of the fluorination-target component was not clearly identified, like the results of conducting the experiment on the temperature and the number of repetitions. In addition, as a result of mapping by energy dispersive spectroscopy, the color corresponding to the F component existed inside the coating, and as the power increased, the color contrast on the surface was more clearly distinguished.

This is also because as the power increased, the density of dissociated F radicals increased while the decomposition of the F-based corrosive gas is further accelerated, thus the reactivity of the coating surface increased, thereby increasing the content of F.

Subsequently, the inventors of the present disclosure selected F contents of 5, 9 and 15 at. % as determined by analyzing the $Y_2O_3$ coating (produced by atmospheric plasma spraying) while changing the temperature, repetition number and power factors, and performed X-ray photoelectron spectroscopy and transmission electron microscopy in order to examine the depth-dependent component changes and thickness of the YOF fluoride layer of the fluorination-target component.

Figure 12:
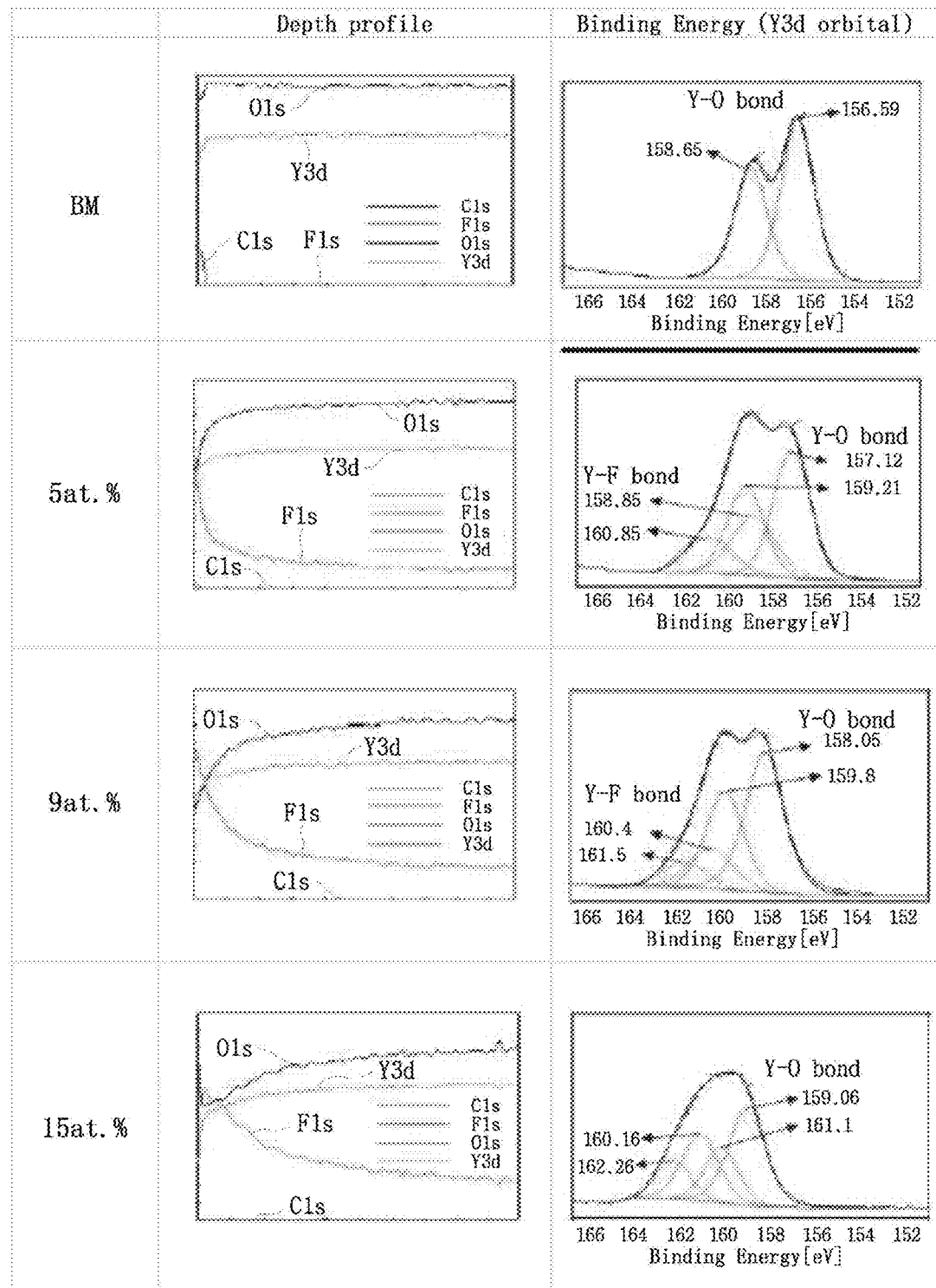
FIG. 12 is a table showing the results of X-ray photoelectron spectroscopy analysis of a fluorination-target component depending on the content of F in the processing method for fluorination of a fluorination-target component according to the present disclosure.

FIG. 12 is a table showing the results of X-ray photoelectron spectroscopy analysis of a fluorination-target component depending on the content of F in the processing method for fluorination of a fluorination-target component according to the present disclosure.

First, using X-ray photoelectron spectroscopy, changes in the content of F depending on the depth from the surface to the inside of the coating were examined, and then the binding energy corresponding to the Y3d orbital on the surface of the fluorination-target component was analyzed to determine the bonding state of atoms.

As a result of analyzing changes in the F content depending on the depth while performing sputtering in units of several nm from the surface, it was confirmed that, in the $Y_2O_3$ coating (produced by atmospheric plasma spraying) before application of the processing method for fluorination, the Y component and the O component were uniformly distributed at 42 and 58 at. %, respectively.

On the other hand, it was confirmed that, in the fluorination-target component to which the processing method for fluorination according to the present disclosure was applied, the F component was detected throughout the coating surface, and maximum F content values of 33, 44, and 36 at. % were shown, and the F content tended to sharply decrease up to a depth of 100 nm, but decreased slowly after a depth of 100 nm, and F contents of 5, 9 and 11 at. %, respectively, were found near a depth of 500 nm.

The reason why the F content differs depending on the depth is that, on the surface, the concentration of dissociated F radicals in the plasma is high, and thus a chemical reaction occurs quickly, and then the F radicals diffuse and penetrate into the coating through micropores or crack, and thus the chemical reaction rate becomes lower because the concentration of the F radical is low.

Meanwhile, the F content on the coating surface, measured using energy dispersive spectroscopic analysis, increased as the temperature, the number of repetitions and the power increased. As a result of measurement using depth profiling, the F contents were 44 at. % and 36 at. %, which were inconsistent with the F contents (9 at. % and 15 at. %) measured by energy dispersive spectroscopic analysis. However, from the depth profiling results, toward the inside of the coating, the slope at the F content of 15 at. % measured by energy dispersive spectroscopy analysis gently decreased compared to the slope at the F content of 9 at. %, and a depth of about 500 nm showed a F content value of 11 at. %, which was higher than the F content (9 at. %) measured by energy dispersive spectroscopy, indicating changes in the F content were consistent with changes in the F content on the coating surface, measured using energy dispersive spectroscopy.

The difference in the F content between these analysis techniques was believed to be because, as mentioned above, the analysis depth of EDS was relatively deep (at least 1 μm), whereas the analysis depth of XPS was about 1 nm (the components of the local surface were analyzed). In addition, as a result of analyzing the Y3d orbital of the $Y_2O_3$ coating produced by atmospheric plasma spraying, two peaks corresponding to Y—O bonds could be identified at binding energies of 158.5 eV and 156.7 eV. This was consistent with the report that all the binding energies corresponding to the Y3d orbital are composed of a pair of two binding energies caused by $Y3d_{5/2}$ and $Y3d_{3/2}$, the intensity ratio thereof is 3:2, and the binding energy difference is 2 eV.

In addition, as a result of performing the same analysis for the $Y_2O_3$ coating produced by atmospheric plasma spraying and having the YOF fluoride layer formed thereon by the processing method for fluorination, four peaks could be identified in the Y3d orbital. As a result of performing analysis based on the Y, O and F components identified using the depth profile and EDS, it could be confirmed that the two peaks except for the peak corresponding to the Y—O bond were the Y—F bonds, indicating that the Y—O bonds shifted to the Y—F bonds having higher binding energy while the $Y_2O_3$ coating produced by atmospheric plasma spraying reacted with the F component to produce the YOF fluoride layer.

Electronegativity refers to a measure of the tendency of an atom to attract electrons to become a negative ion. In general, it is known that, as the electronegativity of an element increases, the binding energy of the element increases. Since the electronegativity of the F atom is 4, which is higher than the electronegativity (3.5) of the O atom, the binding energy of the Y—F bond is measured in a region where it is higher than the binding energy of the Y—O bond. Thus, it could be demonstrated that, when the $Y_2O_3$ coating is exposed to the F-based corrosive gas plasma, the Y—O bonds are partially decomposed and react with the F radical to form new Y—F bonds, thereby producing the YOF fluoride layer.

Figure 13:
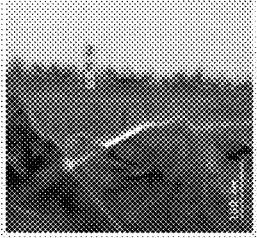
FIG. 13 is a table showing transmission electron microscope images and component analysis of a fluorination-target component depending on the content of F in the processing method for fluorination of a fluorination-target component according to the present disclosure.

FIG. 13 is a table showing transmission electron microscope images and component analysis of a fluorination-target component depending on the content of F in the processing method for fluorination of a fluorination-target component according to the present disclosure.

Next, as a result of analyzing cross-sectional microstructures using a transmission electron microscope (TEM), it was confirmed that a color corresponding to the F component was detected on all the coating surfaces in the coatings having a YOF fluoride layer with a thickness of early 20 nm, and the color contrast increased as the content of the F component increased.

Figure 14:
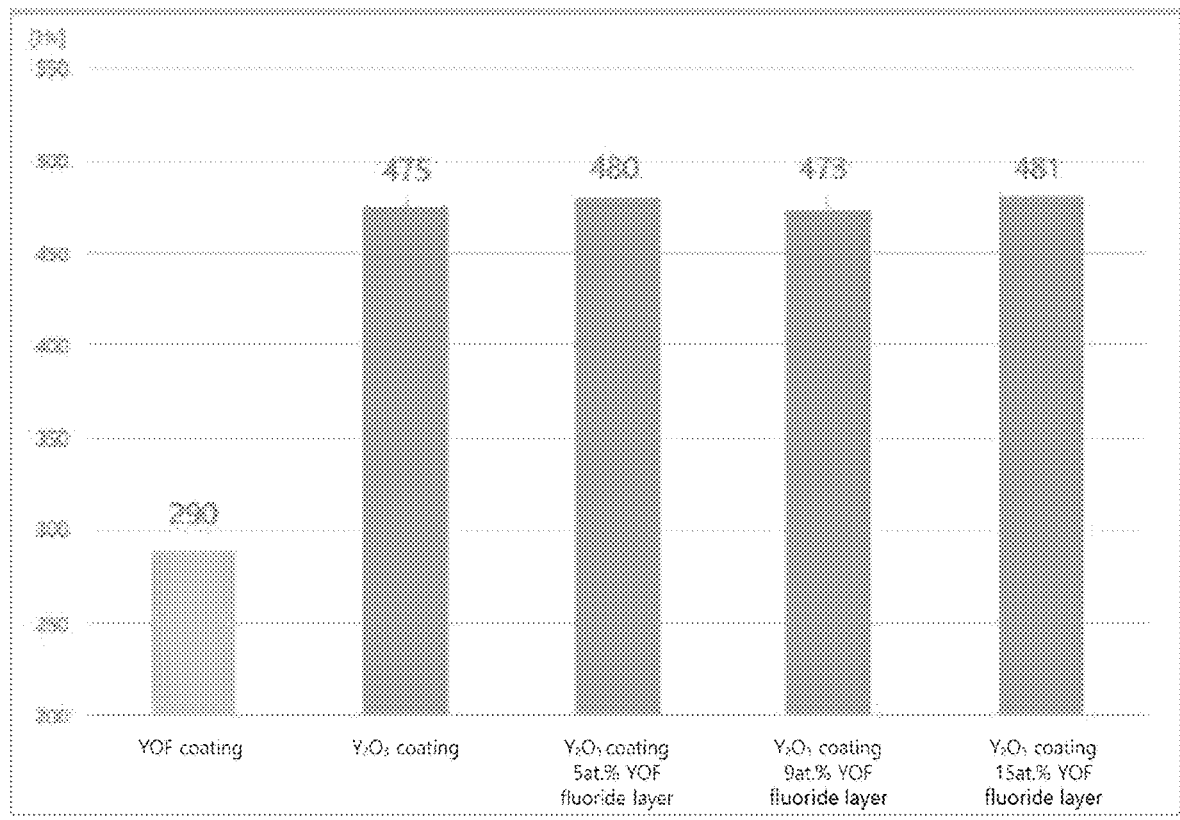
FIG. 14 is a table showing hardness analysis of a fluorination-target component depending on the content of F in the processing method for fluorination of a fluorination-target component according to the present disclosure.

FIG. 14 is a table showing hardness analysis of a fluorination-target component depending on the content of F in the processing method for fluorination of a fluorination-target component according to the present disclosure.

The fluorination-target component to which the processing method for fluorination according to the present disclosure has been applied includes a YOF fluoride layer compared to the $Y_2O_3$ coating (produced by atmospheric plasma spraying) present before application of the processing method for fluorination. Vickers Hardness was measured to examine changes in hardness depending on the content of the F component.

Compared to the hardness value (475 Hv) of the $Y_2O_3$ coating (produced by atmospheric plasma spraying) before application of the processing method for fluorination, the hardness values of all the fluorination-target components including the YOF fluoride layer were within the standard deviation range regardless of the content of the F component. As confirmed from the results described above, it is believed that, since the thickness of the YOF fluoride layer is very thin (several tens to hundreds of nm), the change in hardness depending on the content of the F component is very insignificant.

Figure 15:
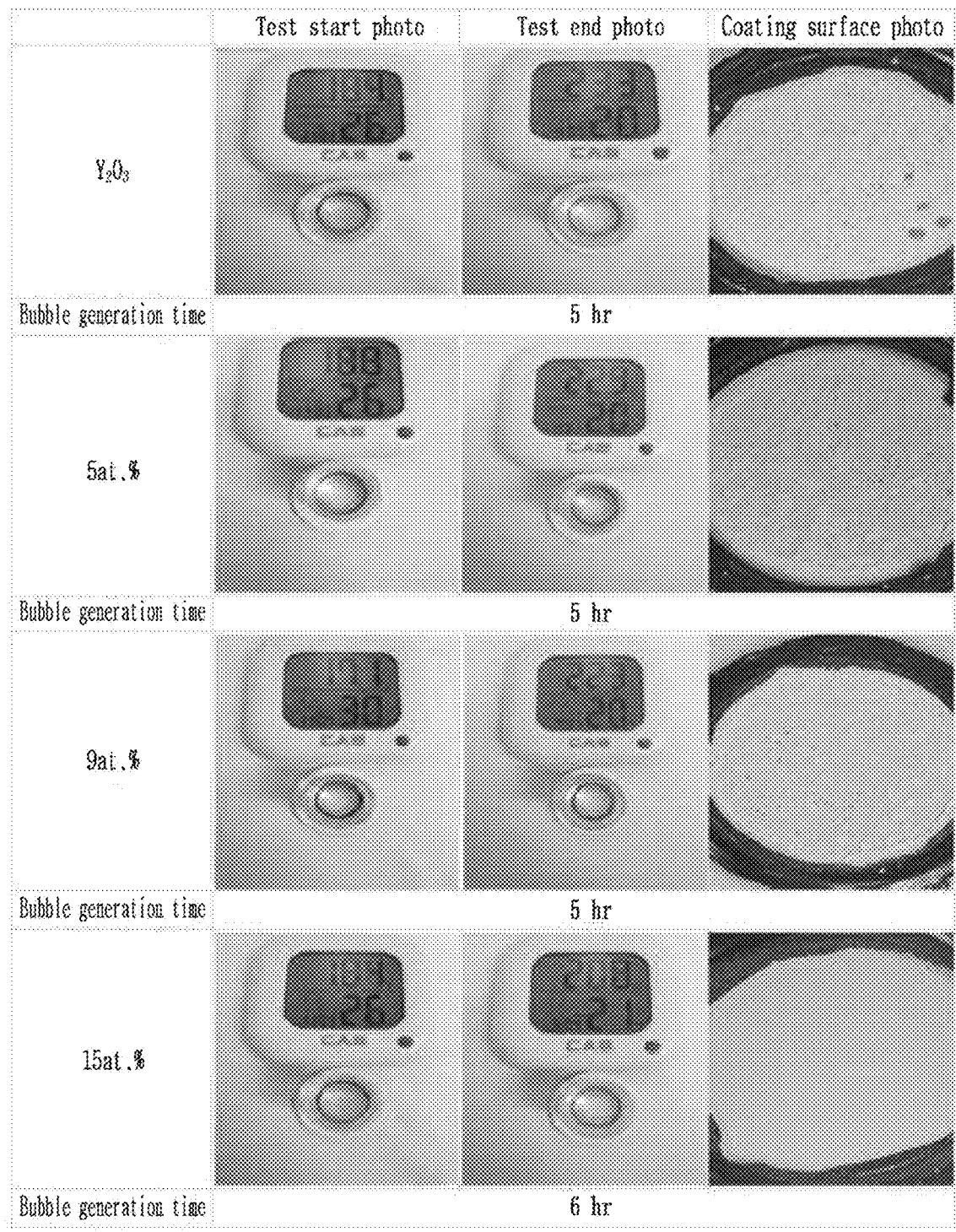
FIG. 15 depicts photographs showing the results of testing the chemical resistance of a fluorination-target component in HCL solution depending on the content of F in the processing method for fluorination of a fluorination-target component according to the present disclosure.

FIG. 15 depicts photographs showing the results of testing the chemical resistance of a fluorination-target component in HCL solution depending on the content of F in the processing method for fluorination of a fluorination-target component according to the present disclosure.

In a semiconductor dry etching process, chemical etching that promotes a chemical reaction with the coating occurs due to the generation of chemically highly active radicals. In order to test the corrosion resistance of the coating, the coating surface was exposed directly to a 5% hydrochloric acid solution was directly exposed to the coating surface and the time until the coating was etched in the hydrochloric acid was measured. Here, the standard was selected as 3 hours.

In this testing, a fluorination-target component to which the processing method for fluorination has been applied was prepared for each F content.

As a result of analyzing changes in chemical resistance, it was confirmed that, when the content of the F component in the YOF fluoride layer in the fluorination-target component was 5 or 9 at. %, bubbles started to be generated by the reaction of the $Y_2O_3$ coating (produced by atmospheric plasma spraying) with hydrochloric acid after 5 hours before application of the processing method for fluorination, whereas, when the content of the F component was the highest (15 at. %), bubbles were generated due to the reaction with hydrochloric acid after 6 hours or more.

Therefore, it can be determined that, as the reaction time increases by 1 hour or more at the highest content of the F component, the resistance to corrosive chemicals increases when the content of the F component is a specific value or higher.

Experiments on Generation of Plasma Contaminant Particles

On the other hand, the inventors of the present disclosure have conducted experiments on the generation of plasma contaminant particles.

Figure 16:
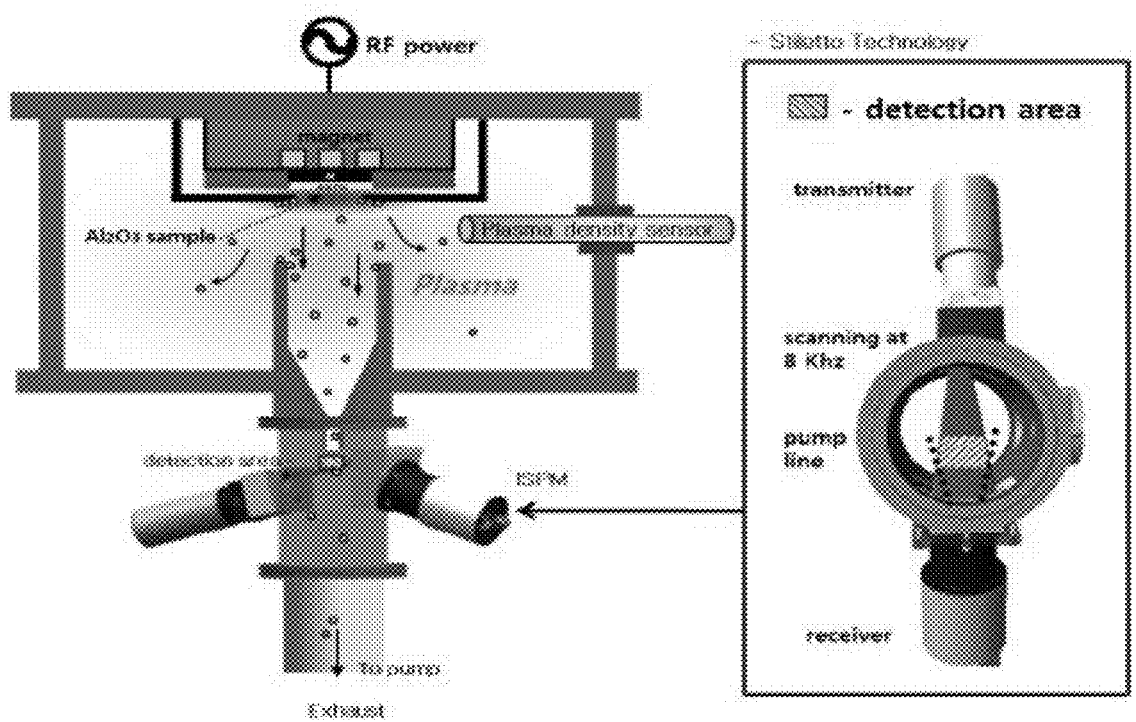
FIG. 16 is a schematic diagram illustrating a method of measuring the time-dependent number of contaminant particles in real time after exposing a fluorination-target component, to which the fluoride processing method according to the present disclosure has been applied, to a plasma containing a fluorine (F)-based corrosive gas.

FIG. 16 is a schematic diagram illustrating a method of measuring the time-dependent number of contaminant particles in real time after exposing a fluorination-target component, to which the fluoride processing method according to the present disclosure has been applied, to a plasma containing a fluorine (F)-based corrosive gas.

The chamber has an inner diameter of 30 cm and a height of 30 cm, and the radius of each of the powered electrode and the grounded electrode is 7.6 cm (3 inch), and plasma discharge occurs between the powered electrode and the grounded electrode. The gap between the powered electrode and the grounded electrode is about 10 cm.

Meanwhile, a fluorination-target component was fabricated by depositing a $Y_2O_3$ coating on a 3-inch circle by atmospheric plasma spraying and then applying the processing method for fluorination based on an atmospheric pressure high-frequency plasma source, and was placed on the powered electrode.

In addition, Ar, CF4 and $O_2$ gases were used as plasma generating contaminant particles, and the Ar, CF4 and $O_2$ gases were supplied at flow rates of 5 sccm, 30 sccm and 25 sccm, respectively, through a showerhead with a mass flow meter, respectively. A magnet was inserted into the powered electrode supplied to increase the plasma density, and the vacuum was maintained for about 60 minutes at an RF power of 150 W and an operating pressure of 300 mTorr by using a dry pump and a turbo pump.

Contaminant particles generated on the fluoridation-target component during etching by the F-based corrosive gas and plasma were measured in real time by a light scattering sensor attached to the exhaust line depending on the time of exposure to the plasma, and the amount and number of contaminant particles larger than 0.2 μm could be measured based on the laser light scattering principle.

Figure 17:
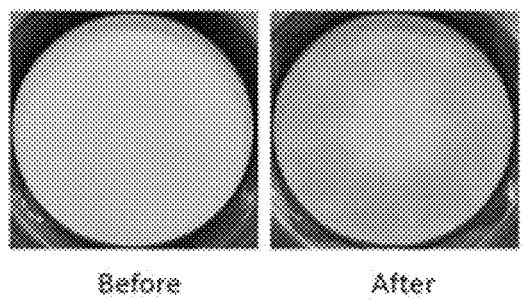
FIG. 17 depicts photographs showing images of fluorination-target components of Examples and Comparative Examples depending on the content of F before and after exposure to plasma.
Figure 17:
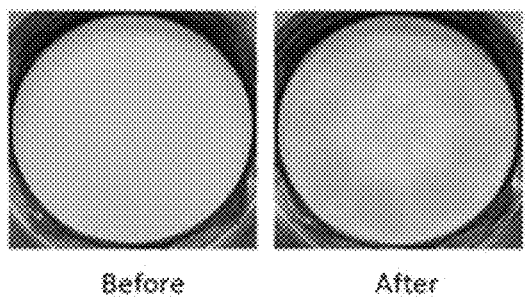
Figure 17:
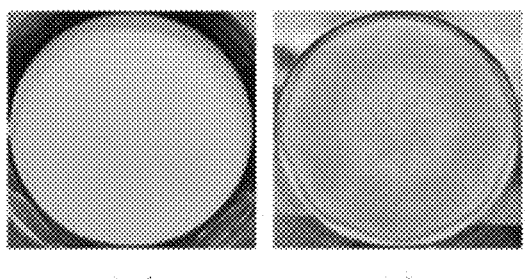
Figure 17:
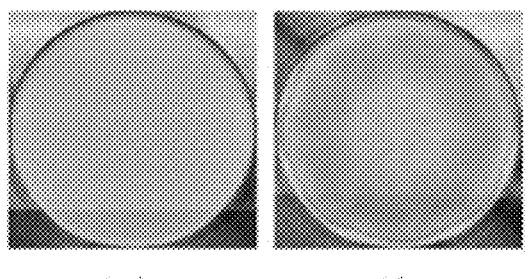

FIG. 17 depicts photographs showing images of fluorination-target components of Examples and Comparative Examples depending on the content of F before and after exposure to plasma.

It was confirmed that, after exposure to plasma, the color of the fluoridation-target component was darkened depending on the orientation of the magnet inserted into the powered electrode to increase the plasma density.

Figure 18:
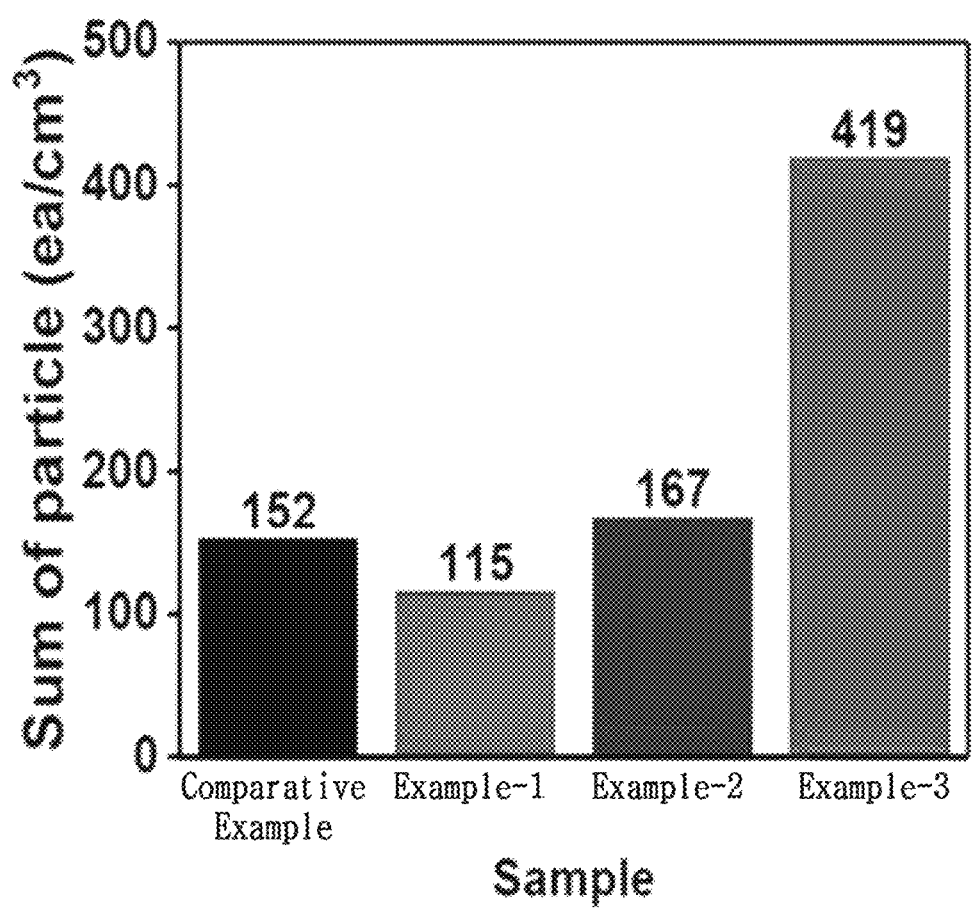
FIG. 18 is a graph showing the sum of contaminant particles on each fluorination-target component depending on the content of F after exposure to a plasma containing an F-based corrosive gas in the present disclosure.

FIG. 18 is a graph showing the sum of contaminant particles on each fluorination-target component depending on the content of F after exposure to a plasma containing an F-based corrosive gas in the present disclosure.

First, in a Comparative Example which is a $Y_2O_3$ coating (produced by atmospheric plasma spraying) before the processing method for fluoridation was applied thereto, a total number of contaminant particles of 152 ea/cm$^3$ was measured after 60 minutes of exposure to the plasma, but in Example 1 which is a fluoridation-target component to which the processing method for fluoridation was applied, the smallest number of contaminant particles (115 ea/cm$^3$) was measured, which corresponds to a decrease in contaminant particles of approximately 23.3%.

On the other hand, in Example 2 and Example 3, the total numbers of contaminant particles gradually increased to 167 and 419 ea/cm$^3$, respectively, and before the fluoride processing method was applied, which were similar to or larger than that on the $Y_2O_3$ coating (produced by atmospheric plasma spraying) before the processing method for fluorination was applied thereto.

Figure 19:
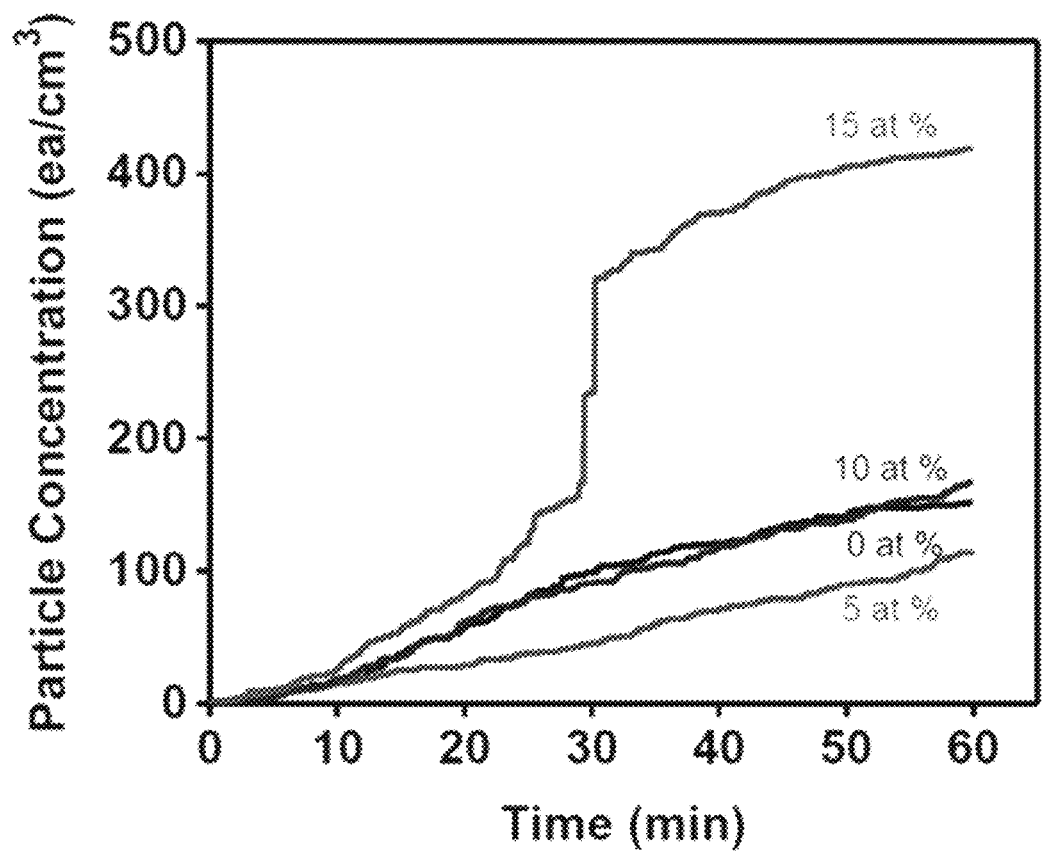
FIG. 19 is a graph showing the results of measuring the number of contaminant particles on each fluorination-target component in real time depending on the content of F during exposure to a plasma containing an F-based corrosive gas.

FIG. 19 is a graph showing the results of measuring the number of contaminant particles on each fluorination-target component in real time depending on the content of F during exposure to a plasma containing an F-based corrosive gas.

First, it was confirmed that, in the $Y_2O_3$ coating (Comparative Example; produced by atmospheric plasma spraying) before the processing method for fluorination was applied thereto, the number of contaminant particles gently increased to 152 ea/cm$^3$ in total during 60 minutes of exposure to the plasma, but in Example 1 which is a fluorination-target component to which the processing method for fluorination according to the present disclosure was applied, the number of contaminant particles showed a tendency similar to that in the $Y_2O_3$ coating (produced by atmospheric plasma spraying) for 10 minutes, but the slope started to decrease after 10 minutes, and the number of contaminant particles decreased to 115 ea/cm$^3$ in total for 60 minutes.

On the other hand, it was confirmed that Example-2 showed almost the same tendency as the $Y_2O_3$ coating (produced by atmospheric plasma spraying) for 60 minutes of exposure to the plasma containing an F-based corrosive gas, and in Example 3, the slope started to increase and then increased abruptly at 30 minutes.

This suggests that, when the content of F in the surface layer of the fluorination-target component to which the processing method for fluorination has been applied is within a specific range, the already formed fluoride layer may act as a protective layer that suppresses chemical reactions with ions dissociated from reactive gases and radicals during exposure to the plasma containing an F-based corrosive gas.

Figure 20:
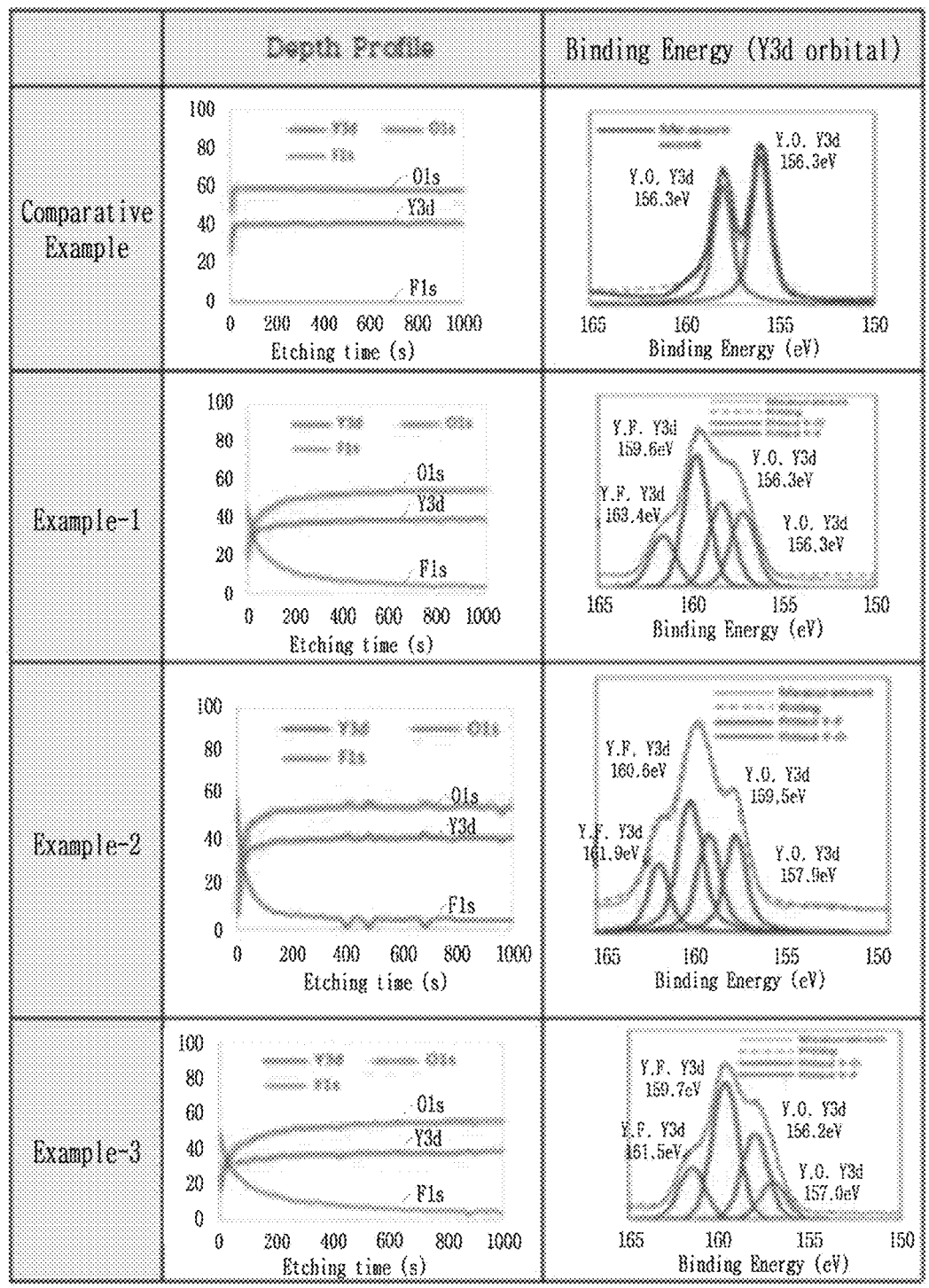
FIG. 20 is a table showing X-ray photoelectron spectroscopy analysis of the content of F before exposure to a plasma containing an F-based corrosive gas in the present disclosure.

FIG. 20 is a table showing X-ray photoelectron spectroscopy analysis of the content of F before exposure to a plasma containing an F-based corrosive gas in the present disclosure.

First, using X-ray photoelectron spectroscopy, changes in the content of F depending on the depth from the surface to the inside of the coating of the fluorination-target component were examined before exposure to the plasma containing an F-based corrosive gas, and then the binding energy corresponding to the Y3d orbital on the surface of the fluorination-target component was analyzed to determine the bonding state of atoms.

As a result of analyzing changes in the F content depending on the depth while performing sputtering in units of several nm from the surface, it was confirmed that, in the $Y_2O_3$ coating (Comparative Example, produced by atmospheric plasma spraying) before application of the processing method for fluorination, the Y component and the O component were uniformly distributed at 38.4 at. % and 59.43 at. %, respectively, indicating that they were uniformly distributed from the surface to the inside, and the F component was not detected at all (0 at. %).

On the other hand, in the fluoridation-target components to which the processing method for fluorination according to the present disclosure was applied, the F component was detected on all the coating surfaces and exhibited maximum values of 47.3, 59.0, and 50.2 at. %, respectively, and the content of the F component tended to decrease rapidly toward the inside, but decreased gently after a depth of 200 nm.

The reason why the content of the F component differs depending on the depth is that, on the surface, the concentration of dissociated F radicals in the reactive gas and radicals dissociated by the plasma is high, and thus a chemical reaction occurs quickly, and then the ions diffuse and penetrate into the coating through micropores or cracks, and thus the concentration of the ions decreases, thus slowing the chemical reaction rate.

Meanwhile, as a result of analyzing the Y3d orbital using depth profiling on the fluoridation-target components depending on the content of F before exposure to the plasma containing an F-based corrosive gas, it was confirmed that, in the $Y_2O_3$ coating (Comparative Example, produced by atmospheric plasma spraying) before application of the processing method for fluorination, two peaks corresponding to Y—O bonds could be found at binding energies of 156.3 eV and 158.3 eV. This was consistent with the report that all the binding energies corresponding to the Y3d orbital are composed of a pair of two binding energies attributable to $Y3d_{5/2}$ and $Y3d_{3/2}$, the intensity ratio thereof is 3:2, and the binding energy difference is 2 eV.

In addition, as a result of performing the same analysis for the fluorination-target component to which the processing method for fluorination was applied, four peaks could be identified in the Y3d orbital. As a result of performing analysis based on the Y, O and F components identified using the depth profile and EDS, it could be confirmed that two peaks were Y—O bonds composed of a pair of two binding energies corresponding to 156.9 eV and 158.1 eV, 157.9 eV and 159.5 eV, or 157.9 eV and 159.56 eV, and the remaining two peaks except for the peaks corresponding to the Y—O bonds were Y—F bonds, indicating that the Y—O bonds shifted to the Y—F bonds having higher binding energy while the $Y_2O_3$ coating (produced by atmospheric plasma spraying) reacted with ions, dissociated from the reactive gas and radicals in the plasma containing the F-based corrosive gas, to produce the YOF fluoride layer.

Electronegativity refers to a measure of the tendency of an atom to attract electrons to become a negative ion. In general, it is known that, as the electronegativity of an element increases, the binding energy of the element increases. Since the electronegativity of the F atom is 4, which is higher than the electronegativity (3.5) of the O atom, the binding energy of the Y—F bond is measured in a region where it is higher than the binding energy of the Y—O bond. Thus, it could be demonstrated that, when the $Y_2O_3$ coating is exposed to the plasma containing the F-based corrosive gas plasma, the Y—O bonds are decomposed and react with ions, dissociated from the reactive gas and radicals, to form new Y—F bonds, thereby producing the YOF fluoride layer.

Figure 21:
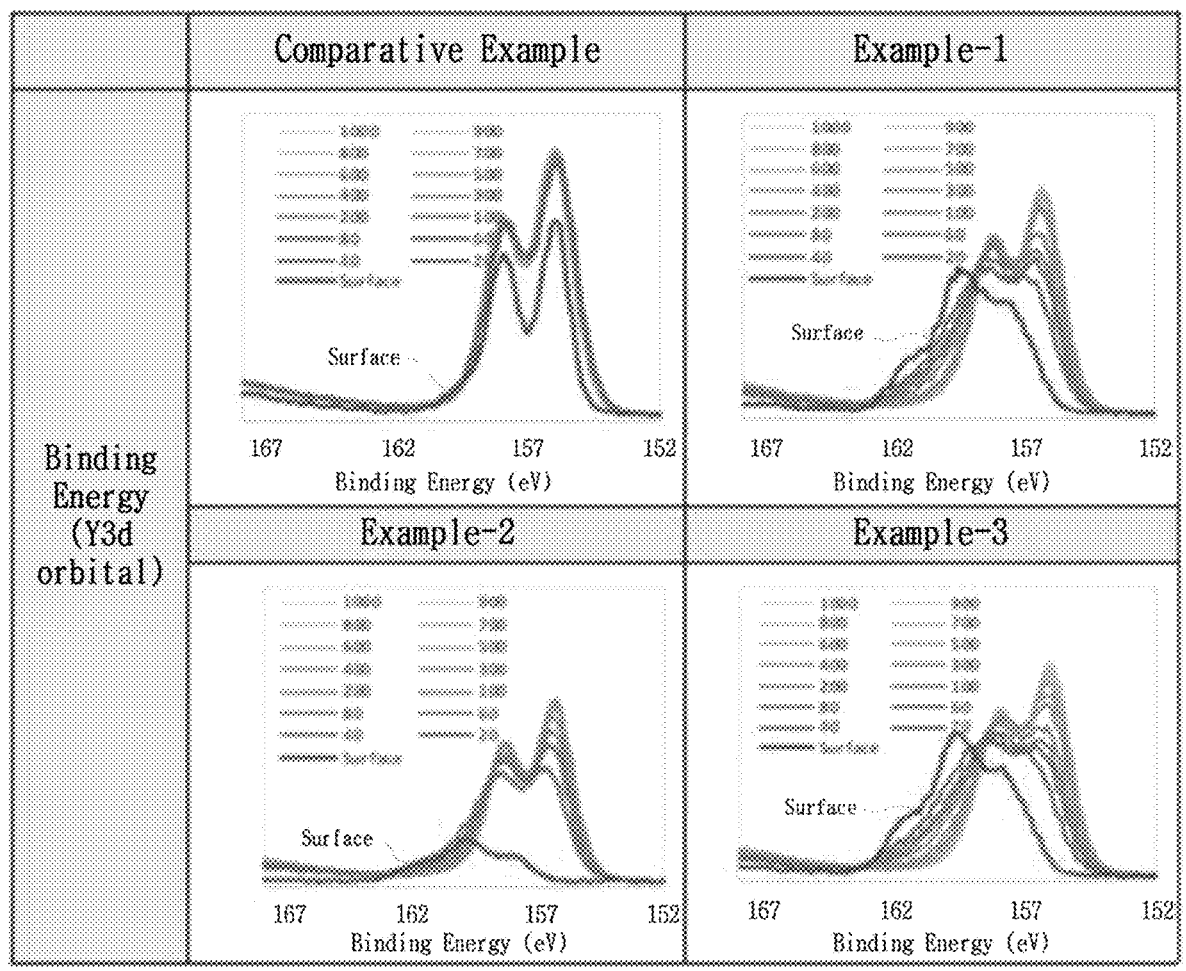
FIG. 21 is a table showing the bonding state of atoms determined by analyzing the binding energy corresponding to the Y3d orbital for each depth from the surface to the inside of the coating on each fluorination-target component depending on the content of F before exposure to a plasma containing an F-based corrosive gas in the present disclosure.

FIG. 21 is a table showing the bonding state of atoms determined by analyzing the binding energy corresponding to the Y3d orbital for each depth from the surface to the inside of the coating on each fluorination-target component depending on the content of F before exposure to a plasma containing an F-based corrosive gas in the present disclosure.

As a result of analyzing changes in the binding energy to the Y3d orbital while performing sputtering in units of several nm from the surface, it was confirmed that the $Y_2O_3$ coating (Comparative Example, produced by atmospheric plasma spraying) before application of the processing method for fluorination did not show any change in the binding energy up to a depth of 1000 nm from the surface to, but all of the fluoridation-target components to which the processing method for fluorination according to the present disclosure has been applied tended to shift to lower energy toward the inside from the surface.

As mentioned above with respect to FIG. 19, the fluoride object to which the processing method for fluorination according to the present disclosure has been applied exhibited a tendency for the content of the F component to decrease and the content of the O component to relatively increase toward the inside from the surface. It could be confirmed that, as the content of the O component increased, the concentration of O atoms having a lower electronegativity than the F atom increased, and thus the Y—O bonds became relatively higher than the intensity of the Y—F bonds, and the binding energy gradually shifted to a lower value.

Figure 22:
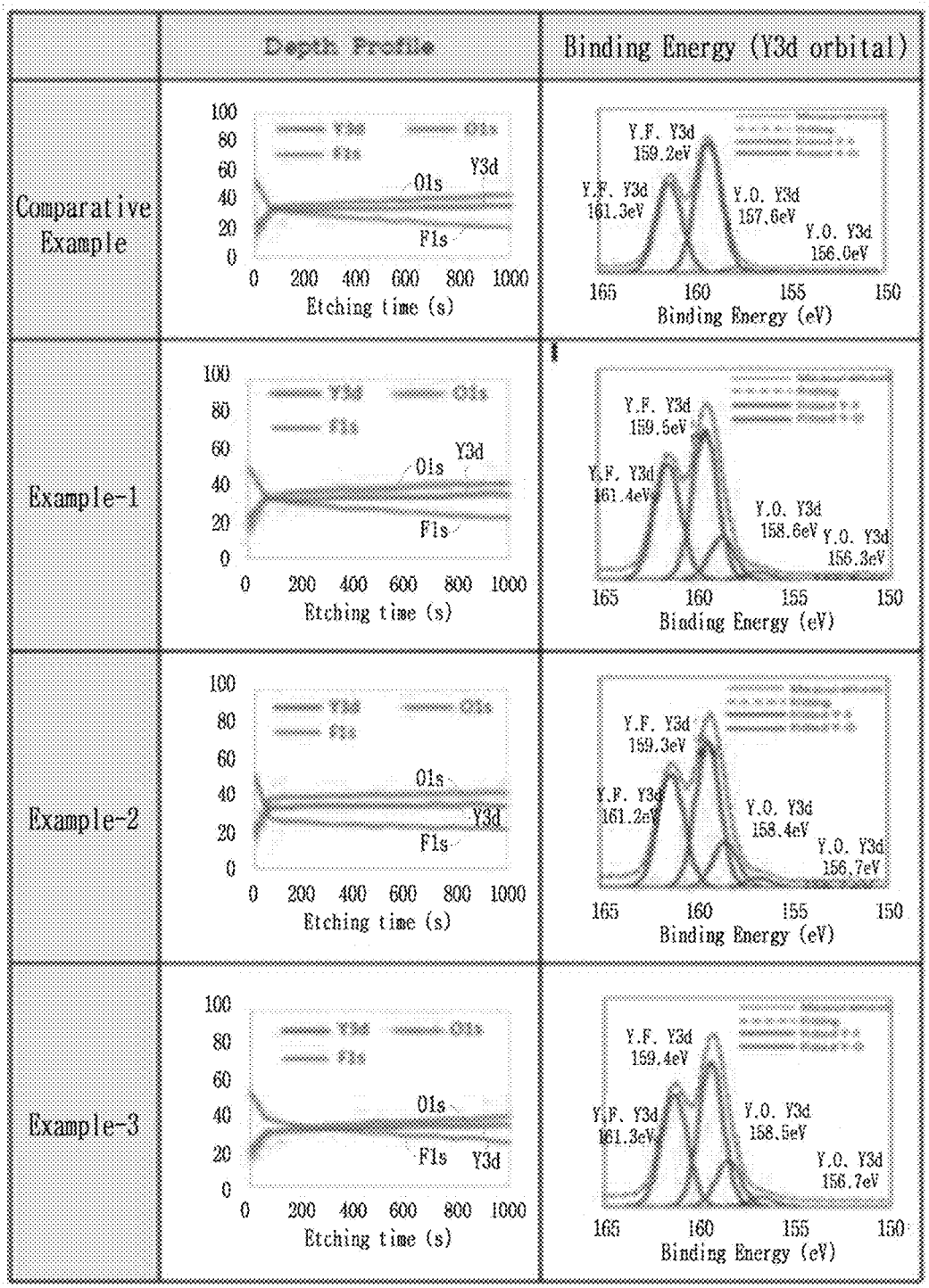
FIG. 22 is a table showing X-ray photoelectron spectroscopy analysis of the content of F after exposure to a plasma containing an F-based corrosive gas.

FIG. 22 is a table showing X-ray photoelectron spectroscopy analysis of the content of F after exposure to a plasma containing an F-based corrosive gas.

Changes in the content of F depending on the depth from the surface to the inside of the coating of the fluorination-target component were examined in the same manner as before exposure to the plasma containing the F-based corrosive gas, and then the binding energy corresponding to the Y3d orbital on the surface of the fluorination-target component was analyzed to determine the bonding state of atoms.

As a result of analyzing changes in the F content depending on the depth while performing sputtering in units of several nm from the surface, it was confirmed that the F component was detected not only in the $Y_2O_3$ coating (Comparative Example, produced by atmospheric plasma spraying) before application of the processing method for fluorination, but also in all of the coatings on the fluorination-target components to which the processing method for fluorination according to the present disclosure has been applied, and the content of the F component tended to decrease rapidly toward the inside and then become gentle.

The reason why the content of the F component differs depending on the depth is that, on the surface, the concentration of dissociated F radicals in the plasma is high, and thus a chemical reaction occurs quickly, and then F radicals diffuse and penetrate into the coating through micropores or cracks, and thus the concentration of the F radicals decreases, thus slowing the chemical reaction rate.

Meanwhile, as a result of analyzing the Y3d orbital using depth profiling on the fluoridation-target components depending on the content of F before exposure to the plasma containing an F-based corrosive gas, it was confirmed that the $Y_2O_3$ coating (Comparative Example, produced by atmospheric plasma spraying) before application of the processing method for fluorination showed not only two peaks corresponding to Y—O bonds at binding energies of 156.6 eV and 158.2 eV, but also Y—F bonds at higher binding energies of 159.1 eV and 161.1 eV. This clearly shows that, upon exposure to the plasma containing the F-based corrosive gas, the Y—O bonds are decomposed and react with ions, dissociated from the reactive gas and radicals, to form new Y—F bonds, thereby producing the YOF fluoride layer.

Figure 23:
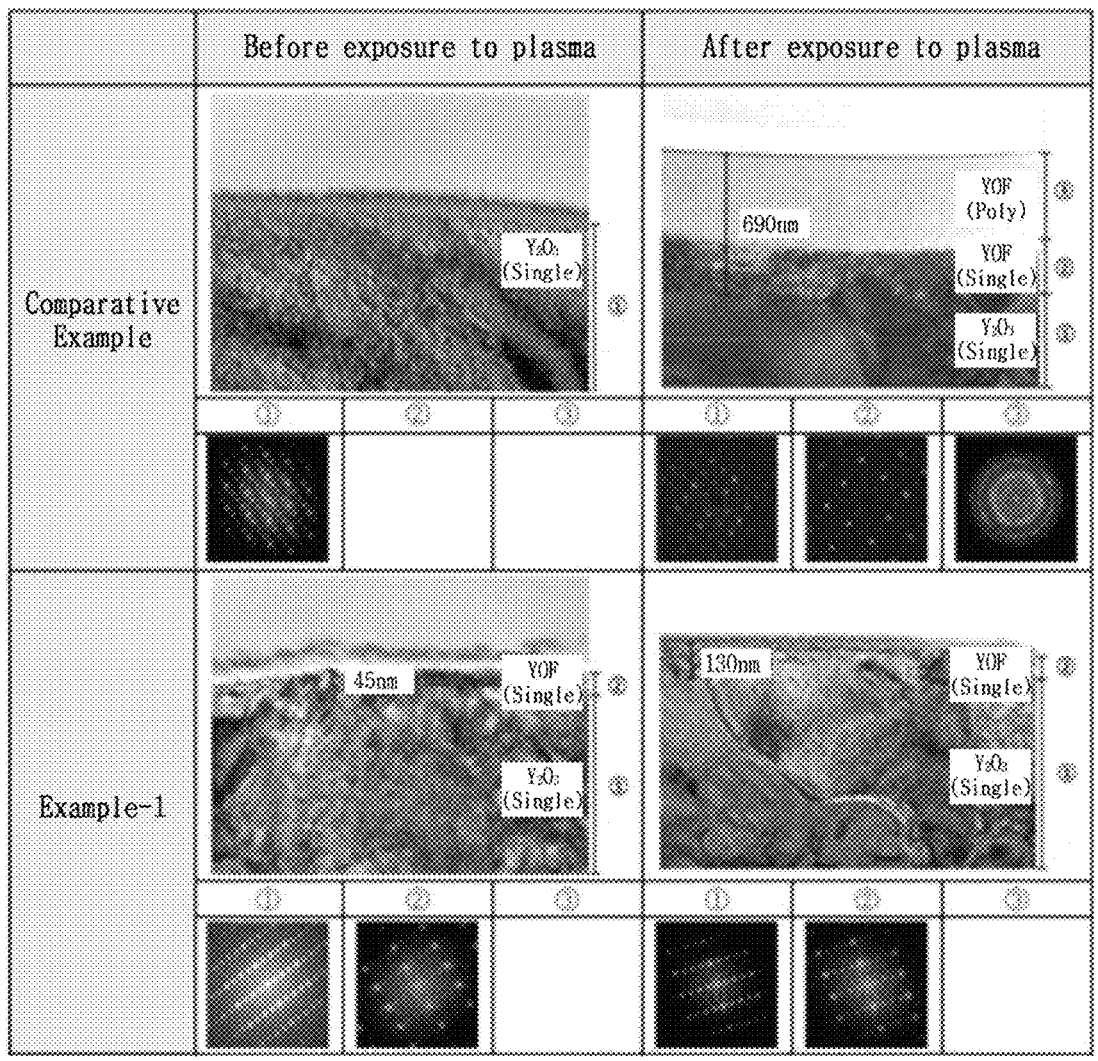
FIGS. 23 and 24 are tables showing transmission electron microscope images and diffraction patterns for the content of F before and after exposure to a plasma containing an F-based corrosive gas in the present disclosure.
Figure 24:
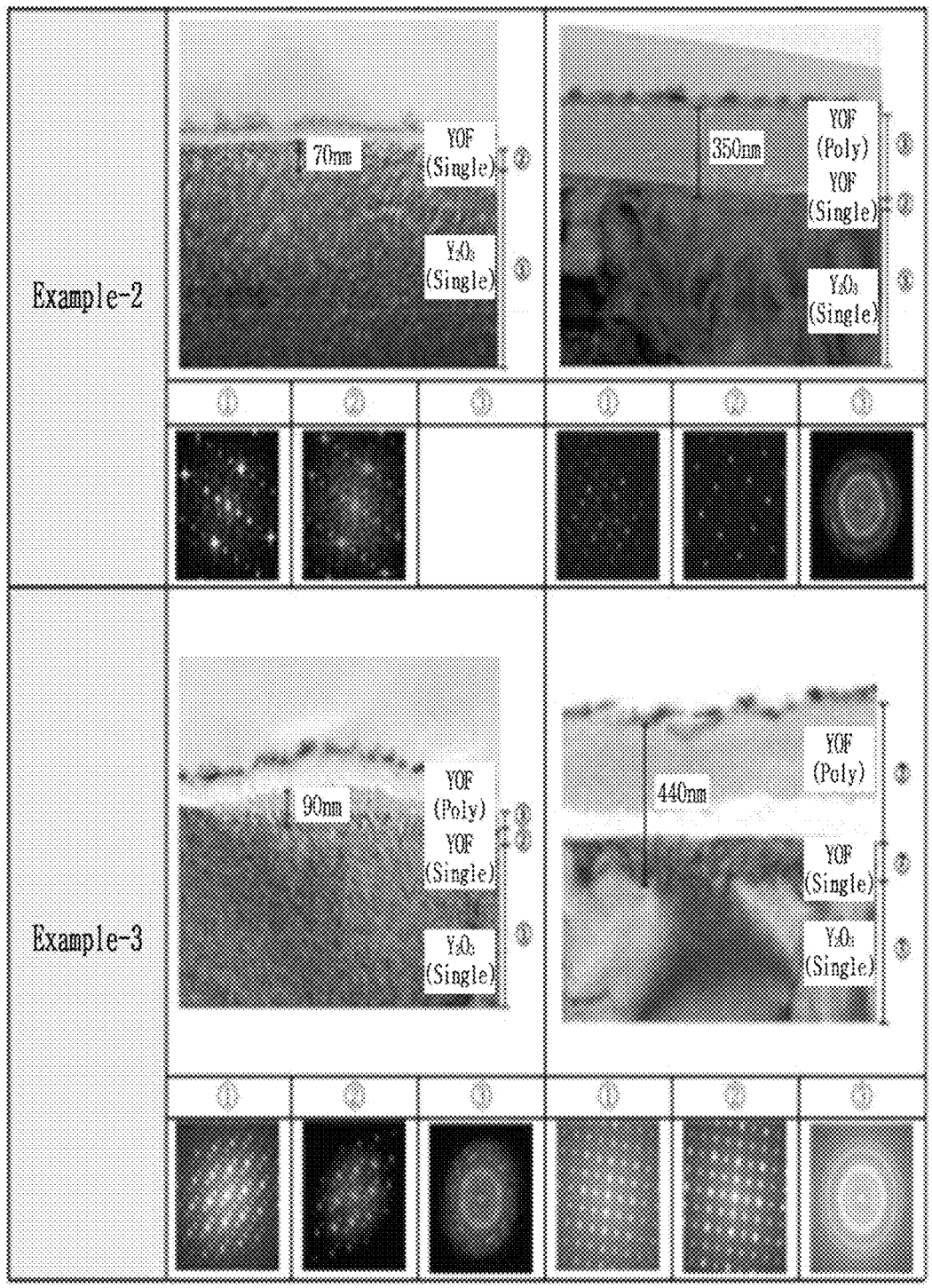

FIGS. 23 and 24 are tables showing transmission electron microscope images and diffraction patterns for the content of F before and after exposure to a plasma containing an F-based corrosive gas in the present disclosure.

First, as a result of analyzing the $Y_2O_3$ coating (Comparative Example, produced by atmospheric plasma spraying) before application of the processing method for fluorination, it was confirmed that, before exposure to the plasma, only single crystals corresponding to $Y_2O_3$ with a constant crystal orientation were observed, but after exposure to the plasma, single crystals corresponding to YOF were formed adjacent to the single crystals corresponding to $Y_2O_3$, and furthermore, polycrystals corresponding to YOF were observed toward the surface, indicating the presence of a tripe structure.

On the other hand, in the case of the fluorination-target components to which the processing method for fluorination according to the present disclosure has been applied, before exposure to the plasma, Examples 1 and 2 showed a dual structure in which a single phase corresponding to YOF was formed adjacent to single crystals corresponding to $Y_2O_3$, but Example 3 showed a triple structure in which a single phase corresponding to YOF was formed adjacent to single crystals corresponding to $Y_2O_3$ and furthermore, polycrystals corresponding to YOF were observed toward the surface, like the Comparative Example after exposure to the plasma.

Meanwhile, in the case of the fluorination-target components to which the processing method for fluorination according to the present disclosure has been applied, after exposure to the plasma, Example 1 maintained the dual structure in which a single phase corresponding to YOF was formed adjacent to single crystals corresponding to $Y_2O_3$, like before exposure to the plasma, Example 2 and Example 3 showed a triple structure in which a single phase corresponding to YOF was formed adjacent to single crystals corresponding to $Y_2O_3$, and furthermore, polycrystals corresponding to YOF were observed toward the surface, like the Comparative Example.

Recently, when $Y_2O_3$ bulk bodies were exposed to plasma containing a corrosive gas of F component at a bias voltage of 150V for 120 minutes, the degree of etching differs in polycrystalline grains, and it is known that more etching occurs in a specific grain direction.

Recently, it was reported that, when $Y_2O_3$ bulk material was exposed to a plasma containing a F-based corrosive gas at a bias voltage of 150V for 120 minutes, a difference in the degree of etching in polycrystalline grains appeared, and more etching occurred in a specific grain direction ("Erosion behavior of $Y_2O_3$ in fluorine-based etching plasmas: Orientation dependency and reaction layer formation Fluorinated-Alumina", Moritz Kindelmann et. al. *Journal of American Ceramistry Society* 2021 104 1465-1474).

Therefore, referring to the number of contaminant particles mentioned in FIGS. 18 and 19, Example-1, which does not contain polycrystals corresponding to YOF, exhibited the smallest number of contaminant particles, indicating that one of the causes of the generation of contaminant particles is the orientation of the grains.

Meanwhile, in the description of the processing method for fluorination according to the present disclosure, the atmosphere in the processing chamber in the first to fourth steps (S100 to S400) is described as being an atmospheric pressure atmosphere, but the atmosphere in the processing chamber may be a vacuum atmosphere or an atmosphere other than the atmospheric pressure atmosphere, as long as the content of fluorine (F) in the YOF surface layer of the fluoride coating layer is within the above-described range. In addition, adjustment of the content of F in such an atmosphere may be achieved by adjusting parameters (gas flow rate ratio, plasma intensity (high-frequency power intensity), chamber atmosphere, chamber temperature, etc.) depending on various process environments or conditions as mentioned above.

According to the processing method for fluorination of a fluorination-target component according to the present disclosure as described above and a fluorinated component obtained, the present disclosure provides a new-concept component fluorination technology capable of fluoridation processing of a component using specific process factors through high-frequency plasma at room temperature and atmospheric pressure for a plasma-resistant coating which is provided on semiconductor dry etching equipment. In addition, according to the present disclosure, it is possible to significantly reduce plasma contaminant particles are generated during formation of a fluoride coating, thereby reducing the reliability of the fluoride coating.

In addition, according to the present disclosure, it is possible to increase productivity by increasing the rate of fluorination (process) performed in the aging step, which is one of the backup processes being performed in semiconductor dry etching equipment. Furthermore, it is possible to reduce the cost relatively while applying the present disclosure to a large-area component with high density and high strength, and increase productivity by increasing the rate of fluorination (process) performed in the aging step.

What is claimed is:

1. A processing method for fluorinating a fluorination-target component, coated with $Y_2O_3$ or YAG to have plasma resistance, in a semiconductor dry etching equipment, the method comprising:
    a first step of placing the fluorination-target component in a processing chamber having a plasma reaction space;
    a second step of introducing a mixed gas into the processing chamber, the mixed gas being composed of a discharge gas selected from among He, Ne, Ar, Kr, and Xe, a fluorine-free reactive gas selected from among $O_2$, $N_2$, and air, and a fluorine-containing reactive gas selected from among fluorocarbons, including $CF_4$, $C_2F_6$, and $C_4F_8$, and nitrogen trifluoride ($NF_3$);
    a third step of supplying the mixed gas, introduced into the processing chamber, into the plasma reaction space; and
    a fourth step of generating plasma in the plasma reaction space by applying high-frequency power to the processing chamber, and fluorinating the fluorination-target component by the generated plasma and fluorine-containing radical gas such that a fluoride coating layer is formed on a surface of the fluorination-target component, the fluoride coating layer including yttrium oxyfluoride (YOF) forming a surface layer of the fluoride coating layer,
    wherein the high-frequency power in the fourth step is 300 to 400 W at a frequency of 1 to 100 MHz, and
    wherein a content of a fluorine (F) component in the yttrium oxyfluoride (YOF) forming the surface layer of the fluoride coating layer is 1 to 10 at. % (atomic percentage).

2. The processing method according to claim 1, wherein an atmosphere in the processing chamber in the first to fourth steps is an atmospheric-pressure atmosphere or a vacuum atmosphere.

3. The processing method according to claim 2, wherein the fluoride coating layer on the fluorination-target component is formed to have a thickness of 150 to 200 μm.

4. The processing method according to claim 1, wherein the third step of supplying the mixed gas comprises supplying argon (Ar) as the discharge gas, oxygen ($O_2$) as the fluorine-free reactive gas, and carbon tetrafluoride ($CF_4$) as the fluorine-containing reactive gas, and a flow rate ratio of Ar:$O_2$:$CF_4$ is 0.1 to 60:0.1 to 10:0.1 to 10.

5. The processing method according to claim 4, wherein the fluoride coating layer on the fluorination-target component is formed to have a thickness of 150 to 200 μm.

6. The processing method according to claim 1, wherein a temperature inside the processing chamber is room temperature to 400° C.

7. The processing method according to claim 6, wherein the fluoride coating layer on the fluorination-target component is formed to have a thickness of 150 to 200 μm.

8. The processing method according to claim 1, wherein the third step and the fourth step are repeated.

9. The processing method according to claim 8, wherein the fluoride coating layer on the fluorination-target component is formed to have a thickness of 150 to 200 μm.

10. The processing method according to claim 1, wherein a distance between the fluorination-target component and the plasma is 2 mm to 5 mm.

11. The processing method according to claim 10, wherein the fluoride coating layer on the fluorination-target component is formed to have a thickness of 150 to 200 μm.

12. The processing method according to claim 1, wherein the fluoride coating layer on the fluorination-target component is formed to have a thickness of 150 to 200 μm.

* * * * *